(12) United States Patent
Calvin

(10) Patent No.: US 7,684,475 B2
(45) Date of Patent: Mar. 23, 2010

(54) CONTROL SYSTEM METHODS AND APPARATUS FOR INDUCTIVE COMMUNICATION ACROSS AN ISOLATION BARRIER

(75) Inventor: James G. Calvin, Mansfield, MA (US)

(73) Assignee: Invensys Systems, Inc., Foxboro, MA (US)

( * ) Notice: Subject to any disclaimer, the term of this patent is extended or adjusted under 35 U.S.C. 154(b) by 0 days.

(21) Appl. No.: 11/956,546

(22) Filed: Dec. 14, 2007

(65) Prior Publication Data

US 2008/0151973 A1  Jun. 26, 2008

Related U.S. Application Data

(63) Continuation of application No. 10/010,061, filed on Nov. 16, 2001, now Pat. No. 7,372,914.

(60) Provisional application No. 60/249,145, filed on Nov. 16, 2000.

(51) Int. Cl.
  *H04L 27/00*  (2006.01)
(52) U.S. Cl. ..................... 375/216
(58) Field of Classification Search ................. 375/219, 375/220, 272, 216; 710/1, 5, 8, 22, 51, 308; 714/9
  See application file for complete search history.

(56) References Cited

U.S. PATENT DOCUMENTS

| | | | |
|---|---|---|---|
| 3,942,168 A | 3/1976 | Whyte | |
| 4,533,874 A | 8/1985 | Fischer et al. | |
| 4,596,022 A | 6/1986 | Stoner | |
| 4,897,854 A | 1/1990 | Harris et al. | |
| 4,899,158 A | 2/1990 | Saeki et al. | |
| 5,438,496 A | 8/1995 | Meur et al. | |
| 5,682,476 A | 10/1997 | Tapperson et al. | |
| 5,793,963 A | 8/1998 | Tapperson et al. | |
| 5,838,722 A * | 11/1998 | Consi | 375/219 |

(Continued)

FOREIGN PATENT DOCUMENTS

EP  1334411  8/2003

(Continued)

OTHER PUBLICATIONS

Supplement European Search Report, Application No. 01 98 4996, Date Feb. 4, 2009, 3 pages.

(Continued)

*Primary Examiner*—Sam K Ahn
(74) *Attorney, Agent, or Firm*—Nutter McClennen & Fish LLP; David J. Powsner; Charlton Shen

(57) ABSTRACT

Improved control apparatus and methods transfer information between devices, such as controllers and field devices, utilizing a modulator that generates a pulse width modulated (PWM) signal containing information to be transferred by a first of the devices, e.g., the controller, to the second device. A transformer or other inductive device transfers the PWM signal across the isolation barrier, where it is demodulated to analog form for application to the second device, e.g., the field device. Information transferred from the second device to the first device can be transferred in an amplitude modulated (AM) signal that utilizes, as its carrier, a fixed duty cycle output of the modulator that generates the PWM signal.

21 Claims, 25 Drawing Sheets

U.S. PATENT DOCUMENTS

| | | | |
|---|---|---|---|
| 5,900,683 | A | 5/1999 | Rinehart et al. |
| 6,151,689 | A * | 11/2000 | Garcia et al. ................... 714/49 |
| 6,260,162 | B1 * | 7/2001 | Typaldos et al. .............. 714/55 |
| 6,295,272 | B1 | 9/2001 | Feldman et al. |
| 6,297,691 | B1 | 10/2001 | Anderson et al. |
| 6,678,766 | B1 * | 1/2004 | Feustel ....................... 710/100 |
| 6,823,028 | B1 | 11/2004 | Phanse |
| 7,372,914 | B2 | 5/2008 | Calvin |

FOREIGN PATENT DOCUMENTS

WO      WO-9917508      4/1999

OTHER PUBLICATIONS

"Principles of Power Conversion-3. Switching Power Supplies," Zytec.com, Jul. 16, 2000, http://www.zytec.com/html/principles_of_power_conversion1.htm, 8 pgs.

Analog Services, Inc., "HART Application Note", Dec. 10, 2007, http://www.analogservices.com/hstart.htm, 32 pgs.

O'Grady, A. et al. "Analog Devices: Analog Dialogue: Build a Smart Analog Process-Instrument Transmitter with Low-Power Converters and a Microcontroller," *Analog Dialogue*, Dec. 10, 2007, http://analog.com/library/analogDialoque/archives/31-1/Smart_Analog.html, 6 pgs.

Pickering, P. "A System Designer's Guide To Isolation Devices," *Sensors*-Jan. 1999, Jul. 12, 2000, http://sensormag.com/articles/0199/iso0199/main.shtml, 9 pgs.

Wayne, Scott "Finding the Needle in a Haystack: Measuring small differential voltages in the presence of large common-mode voltages," *Analog Dialogue*, vol. 34, No. 1, Jan.-Feb. 2000, Jul. 12, 2000, http://www.analog.com/publications/magazines/Dialogue/archives/34-01/haystack/, 6 pgs.

* cited by examiner a. Re-evaluation results in duration update.

b. Re-evaluation results in no duration update.

CONTROL SYSTEM METHODS AND APPARATUS FOR INDUCTIVE COMMUNICATION ACROSS AN ISOLATION BARRIER

The present application is a continuation of U.S. patent application Ser. No. 10/010,061 filed on Nov. 16, 2001, entitled "Control System Methods and Apparatus for Inductive Communication Across an Isolation Barrier," which claims the benefit of priority of United States Provisional Patent Application Ser. No. 60/249,145, filed Nov. 16, 2000, entitled CONTROL SYSTEM METHODS AND APPARATUS FOR INDUCTIVE COMMUNICATION ACROSS AN ISOLATION BARRIER. The contents of the applications are hereby incorporated herein by reference in their entirety.

BACKGROUND OF THE INVENTION

The invention relates to control systems and, more particularly, to methods and apparatus for transferring information across an isolation barrier between control devices such as, by way of non-limiting example, field devices and the systems that monitor and/or control them. The invention has application in the exchange of data/control signals in process, industrial, environmental and other control systems.

The terms "control" and "control systems" refer to the control of a device or system by monitoring one or more of its characteristics. This is used to insure that output, processing, quality and/or efficiency remain within desired parameters over the course of time. In many control systems, digital data processing or other automated apparatus monitor a device, process or system and automatically adjust its operational parameters. In other control systems, such apparatus monitor the device, process or system and display alarms or other indicia of its characteristics, leaving responsibility for adjustment to the operator.

Control is used in a number of fields. Process control, for example, is typically employed in the manufacturing sector for process, repetitive and discrete manufactures, though, it also has wide application in utility and other service industries. Environmental control finds application in residential, commercial, institutional and industrial settings, where temperature and other environmental factors must be properly maintained. Control is also used in articles of manufacture, from toasters to aircraft, to monitor and control device operation.

Modern day control systems typically include a combination of field devices, control devices, workstations and, sometimes, more powerful digital data processors. Field devices are the "eyes, ears and hands" of the control system. They include the temperature, flow and other sensors that are installed on or in the process equipment to measure its characteristics. They also include positioners and other actuators that move or adjust the equipment settings to effect control.

Controllers generate settings for the control devices based on measurements from sensor type field devices. Controller operation is typically based on a "control algorithm" that maintains a controlled system at a desired level, or drives it to that level, by minimizing differences between the values measured by the sensors and, for example, a setpoint defined by the operator.

Workstations, control stations and the like are typically used to configure and monitor the process as a whole. They are often also used to execute higher-levels of process control, e.g., coordinating groups of control devices and responding to alarm conditions occurring within them.

In an electric power plant, for example, a workstation coordinates control devices that actuate conveyors, valves, and the like, to move coal or other fuels to a combustion chamber. The workstation also configures and monitors the control devices that maintain the dampers to control the level of combustion. The latter operate, for example, by comparing in the temperature of the combustion chamber with a desired setpoint. If the chamber temperature is too low, the control algorithm may call for incrementally opening the dampers, thereby, increasing combustion activity and driving the temperature upwards. As the temperature approaches the desired setpoint, the algorithm incrementally levels the dampers to maintain the combustion level.

The field devices, control devices, workstations and other control-related that make up a process control system are typically connected by a hierarchy of communications lines. Ever increasingly, these are Ethernet or other IP network connections, though various buses are still in use, especially linking field devices to their control devices.

Regardless, the field devices are typically electrically isolated from the rest of the control system. In the case of the electric power plant, for example, this is necessary to prevent harm to the control devices, workstations and other plant equipment—not to mention the plant personnel—from the high voltages and currents existing where the power is actually generated. The reverse is likewise true: static discharges or standard line voltages present in the plant control room could knock out field devices, or worse, if circuited back to the power-generating equipment.

The art suggests a number of mechanisms for transferring control and data signals between control systems and field devices across an electrical isolation barrier. These include optical and capacitance-based mechanisms, though, the most popular form of isolation relies on inductance, typically, as embodied in transformers.

Transformer-based isolation has several advantages over competing mechanisms. Among these are lower cost, durability and reliability. However, when utilizing conventional circuits such as shown in FIG. 1, the bandwidth of the data transfers is limited—unless resort is had to unduly large transformers. This can be problematic in applications where power or physical space are limited.

An object of this invention is to provide improved methods and apparatus for communication across an isolation barrier. A more particular object is to provide such methods and apparatus as are based on inductive transfer across the barrier and are suitable for use with process, industrial, environmental and other control systems.

Another object of the invention is to provide such methods and apparatus as are suited for use in transferring information between control devices that normally rely on analog signaling, such as the industry standard FoxComm™ and HART™ protocols, to communicate control, data and other information signals.

A further object of the invention is to provide such methods and apparatus as can be implemented with minimum consumption of power and minimum use of physical space. A related object is to provide such methods and apparatus as do not generate undue heat.

Still yet a further object is to provide such methods as can be implemented at low cost, using existing off-the-shelf technologies.

SUMMARY OF THE INVENTION

The foregoing are among the objects achieved by the invention, one aspect of which provides improved apparatus for transferring information between control devices over a galvanic or other isolation barrier. The apparatus has a modulator that generates a pulse width modulated (PWM) signal from a frequency shift keying (FSK), or other frequency modulated (FM) signal, containing information being transferred by a first control device, e.g., a controller. A transformer or other such circuit element inductively transfers the PWM signal across the isolation barrier, where it is demodulated to analog form for application to a second control device, e.g., a field device (or controller)

Further aspects of the invention provide apparatus as described above in which the PWM signal is generated from an FSK signal output by a modem, e.g., that is coupled to a control device (such as a controller) generating information to be transferred. Such an FSK signal can be compatible with a FoxComm™, HART™ or other industry standard or proprietary FSK or FM protocol.

Still further aspects of the invention provide apparatus as described above in which the PWM signal is demodulated by a low pass filter. Such a filter can be constructed, for example, using an resistor capacitor (RC) circuit. A buffer is utilized, according to related aspects of the invention, to modify the impedance of the RC circuit for output to the field device.

By way of example of the foregoing, digital signals representing command and data output by a controller are converted to analog FSK form by a modem. The analog signal is applied to a pulse width modulator that generates a fixed-frequency PWM signal having pulses whose widths vary in accord with the amplitude of the FSK signal and, therefore, in accord with the controller output. The PWM signal is carried over the isolation barrier by a transformer and routed to a low pass filter that demodulates it back into analog FSK form. The FSK signal can be routed to a field device, e.g., via an intelligent transmitter.

Further aspects of the invention provide apparatus as described above equipped for transferring information from the second control device (e.g., the field device) to the first control device (e.g., the controller). A modulator generates an amplitude modulated (AM) signal from an FSK signal embodying the information generated by the second device for transfer. That AM signal utilizes a carrier component that is based on a fixed duty cycle output of the pulse width modulator used to transfer information in the reverse direction. That AM signal is transferred over the isolation barrier by the transformer, where it is demodulated to FSK form for application, e.g., to a modem and, then, to the controller.

By way of example, an FSK data signal received from a field device is multiplied by an AND gate with the output of the pulse width modulator, which is set at a fixed width duty cycle when the controller is not transmitting. The resulting AM signal is transmitted over the transformer to the control side, where an envelop detector demodulates it back to FSK form for further demodulation to digital, by the controller's modem, and processing by the controller.

Further aspects of the invention provide individual control system devices constructed and operated in accord with the foregoing.

Apparatus configured and operating as described above have the advantage of permitting information encoded in analog FSK signals (and, in turn, encoded in PWM and AM signals) to be transmitted between electrically isolated components of a control system over small, low power transformers.

BRIEF DESCRIPTION OF THE DRAWINGS

A more complete understanding of the invention may be attained by reference to the drawings, in which.

DETAILED DESCRIPTION OF THE ILLUSTRATED EMBODIMENT

Figure 1:
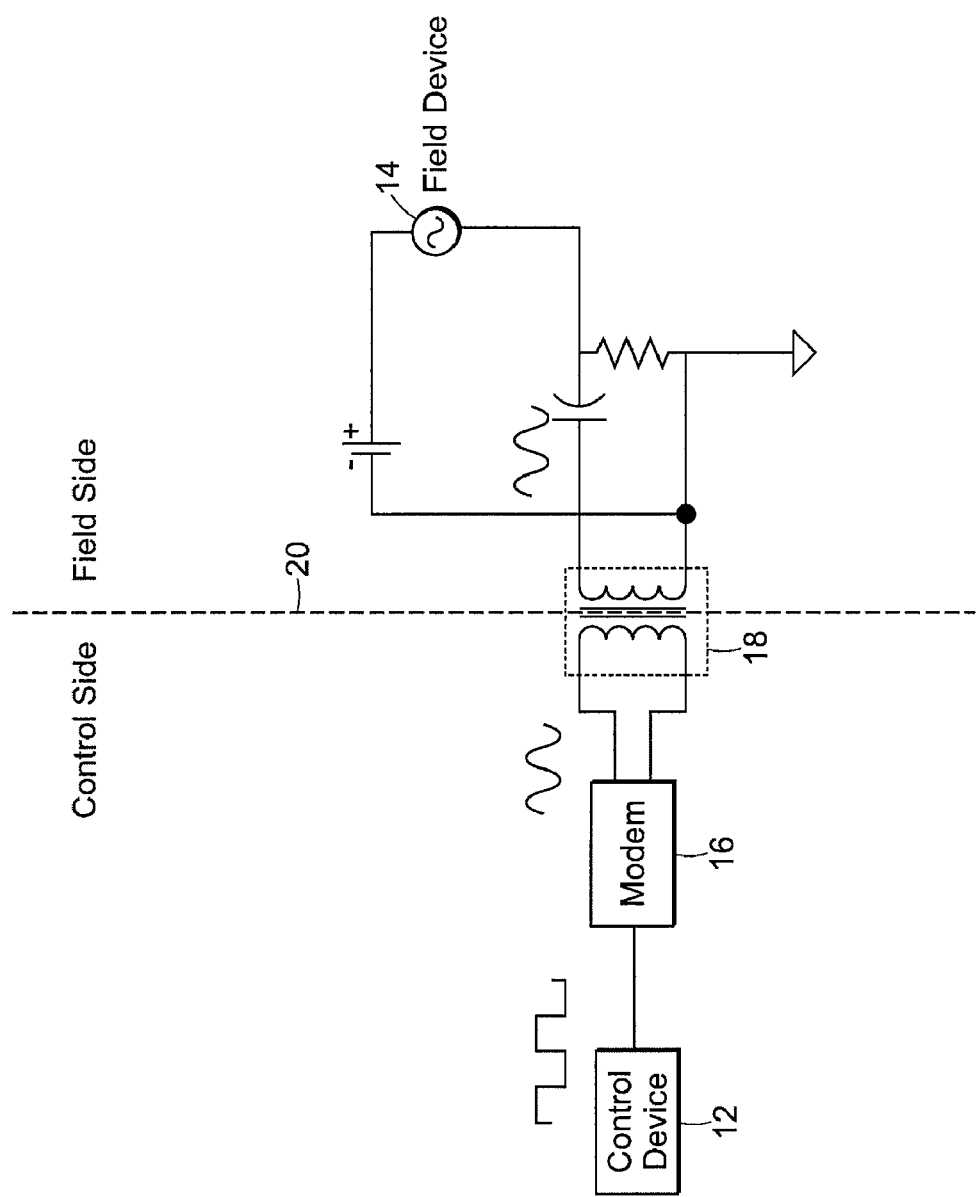
FIG. 1 depicts a prior art configuration for transmitting information over an isolation barrier between a control device and a field device.

FIG. 1 illustrates a prior art system for galvanic isolation of the components of a process control system. Here, a control device 12 (e.g., a controller) generates a digital signal for controlling a field device 14. Those signals are transmitted to a modem (which may be integral to the control device or, more typically, coupled to it via a serial port) and modulated to analog form, more specifically, an frequency shift keying form, which can be a "tone" signal in the range of 1-5 kHz. A transformer 18 is used to pass the FSK signal across an isolation barrier 20 from the "control side" of the system to the "field side," where it can be applied to the field device directly, via a modem, or otherwise. By a similar mechanism, data (or other control) signals generated by the field device 14 are passed back over the transformer in FSK form, demodulated to digital form and routed to the control device 12 for processing. A drawback of systems of the type illustrated in FIG. 1 is the cost, large size and high power requirements of the transformers required to transfer the FSK signals across the isolation barrier.

Figure 2:
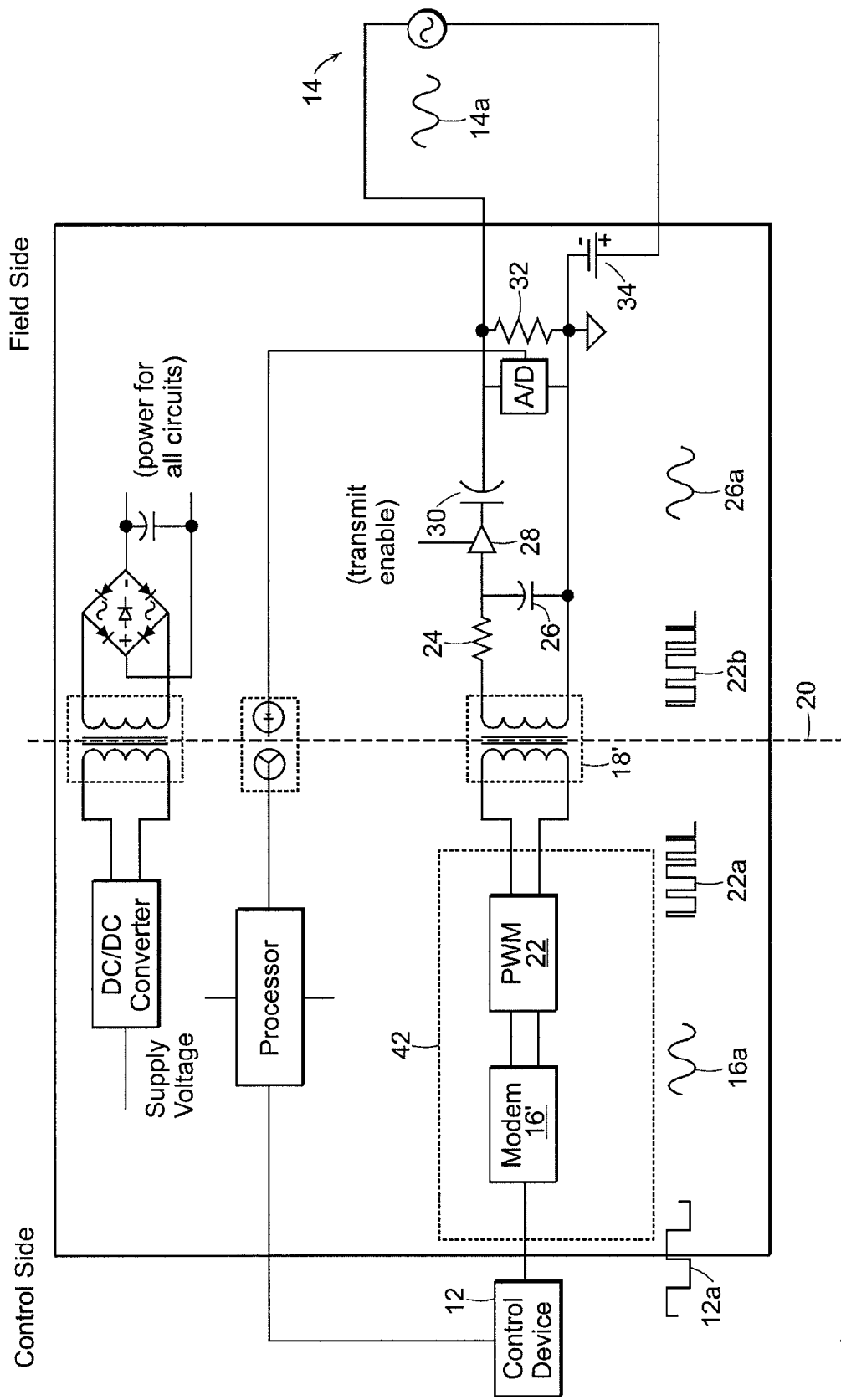
FIG. 2 depicts a system according to the invention for transmitting frequency shift keying (FSK) signals that are, in turn, encoded in PWM signals over an isolation barrier from control device to field device.

FIG. 2 illustrates a system according to the invention for transmitting control, data and other information across an isolation barrier from a control device 12 to a field device 14. The illustrated embodiment is described in the context of process control, though those skilled in the art will appreciate that the invention has application in industrial, environmental and other control systems as well.

Like numbered elements in FIGS. 1 and 2 pertain to like devices that perform like functions. Thus, the system of FIG. 2 includes a first control device, such as controller 12, that generates a signal embodying command, data or other information (hereinafter, a "control" signal) for transfer to a second control device, such as field device 14. By way of non-limiting example, in the illustrated embodiment, controller 12 can be any type of control device, such as a controller, workstation, or the like. By way of further non-limiting example, field device 14 can be any of an actuator-type or sensor-type field device, of the "smart" variety or otherwise, available from the assignee hereof, or otherwise.

Of course, those it will be appreciated that the invention has application in the transfer of information between any variety of control devices. Thus, in further embodiments of the invention, the first and second control devices can be any of workstations, field controllers, field devices, smart field devices, or other device for any of industrial, manufacturing, service, environmental, or process control. Moreover, though the illustrated devices 12, 14 are in a control relationship, those skilled in the art will appreciate that the isolation mechanisms described herein can be utilized for communications between any devices in a control environment, regardless of whether those devices control one another, are controlled by one another, are peers or otherwise.

In the illustrated embodiment, the control signal generated by device 12 is in digital form (as graphically depicted by square wave 12a). This can be any proprietary or industry standard digital signal embodying desired command, data or other information generated by the device 12. The control signal is modulated to analog form (as graphically depicted by sine wave 16a) by modem 16' in any manner, proprietary or otherwise, known in the art. By way of non-limiting example, in the illustrated embodiment, the analog form is a frequency shift keying (FSK) signal defined by "tones" in the range of 1-5 kHz range that are superimposed on a 4-20 mA current signal, in the manner of industry standard Fox-Comm™ and HART™ protocols. Of course, those skilled in the art will appreciate that the invention has application in the transfer of other FSK and/or other frequency modulated signals, as well. This FSK (or tone) signal is superimposed on a 4 0

Pulse width modulator 22 converts the FSK control signal to a pulse width modulated (PWM) form, as graphically depicted by wave 22a. Such conversion can be accomplished using any proprietary or industry standard PWM circuitry and techniques known in the art and, preferably, is accomplished as described below. The modulator 22 can operate at any frequency suitable for the purposes hereof and, by way of non-limiting example, in the illustrated embodiment operates at 1 MHZ.

With further reference to FIG. 1, the PWM-encoded control signal is applied to transformer 18' for transfer across the isolation barrier. The isolation barrier constitutes any physical barrier across which isolation is desired. This can be a physical barrier, such as a quartz, glass, ceramic or other separation medium. It can also be a "virtual" barrier, such as an equipment boundary, plant boundary, and/or geographic point across which galvanic or other electrical (and physical) protection is desired. Regardless, the barrier 20 need only permit the inductive transfer of electromagnetic waves, e.g., of the type generated between the primary and secondary coils of a transformer 18' or other inductive circuit elements.

Transformer 18' comprises any transformer or other combination of devices suitable for inductive transfer over the isolation barrier. This can be a transformer of the type conventionally used in the process and other control arts for such purpose. Preferably, however, it is a smaller, less costly and uses less power than traditional transformers that are used to transfer FSK signals directly (i.e., without encoding in PWM form). By way of non-limiting example, transformers suitable for the inductive transfer of PWM signals encoding control, data and other information in embodiments of the type shown in FIG. 2 have inductance in the range of 600 µH-700 µH and, more preferably, 750 µH-900 µH and, still more preferably, 1000 µH-1500 µH. Suitable such transformers 18' of the type available, by way of non-limiting example, from Pulse Engineering, Inc., are suitable for this purpose.

PWM-encoded control signals inductively transferred by the transformer 18' across the isolation barrier are graphically depicted by wave 22b in the drawing. These signals are demodulated back into analog form and, particularly, into FSK form, in any manner, proprietary or otherwise, known in the art. In the illustrated embodiment, by way of non-limiting example, this is accomplished through use of a low pass filter comprising a combination of resistor 24 and capacitor 26. In the illustrated embodiment these are arranged to pass the low frequency components in the range of 0-10 kHz and, preferably, 1 kHz-5 kHz, though, those skilled in the art will appreciate that other ranges and/or combinations of components can be used to provide the desired demodulation.

The demodulated signal is graphically depicted by sine wave 26a. The impedance of the analog signal is adjusted, in the illustrated embodiment, by buffer 28 of the type conventionally used in the art for this purpose. A Transmit Enable signal is applied to the buffer 28 during periods when information is being transmitted from the control device 12 to the field device 14.

The impedance-adjusted signal is applied to the field device 14 directly, via a modem, or otherwise, over a conventional transmit/receive loop. In the illustrated embodiment, by way of non-limiting example, this loop comprises capacitor 30, resistor 32 and power source 34, which are arranged in the manner shown and whose respective values are selected in the conventional manner in the art to effect transfer of the analog control signal to the field device 14 and receipt of data generated by it.

The illustrated embodiment demodulates the PWM-encoded control signals into an analog form substantially the same as the format output by modem 16. Thus, for example, where analog control signal 16a is in a FoxComm™ format, signal 26a is demodulated into that format, as well. Alternate embodiments of the invention demodulate the PWM-encoded control signals into alternate analog formats (e.g., a HART format) or into digital formats, e.g., as determined by the needs of the field device to which the demodulated signal is to be applied.

Figure 3:
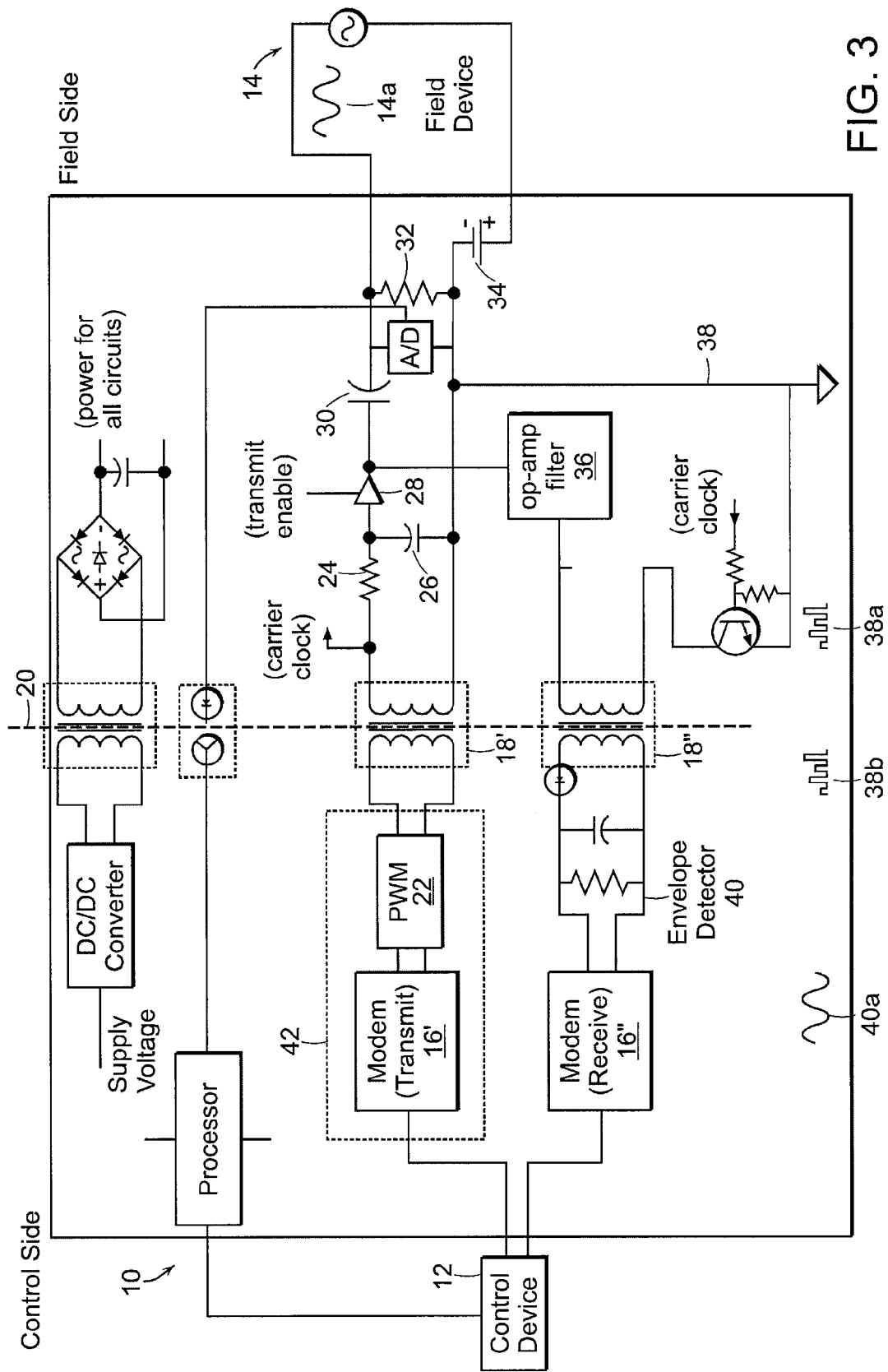
FIG. 3 depicts the system of FIG. 2, additionally showing the transmission of FSK signals that are, in turn, encoded in AM signals over the isolation barrier from the field device to the control device.

FIG. 3 illustrates circuitry utilized in accord with the apparatus of FIG. 2 for transmitting data and other information across the isolation barrier 20 from field device 14 to control device 12. Analog FSK signals containing that data and other information (hereinafter, device signals) generated by the field device in the conventional manner are received in the aforementioned loop, e.g., via direct application by the field device 14, via modem or otherwise. In a preferred embodiment, these signals originate in digital form at the field device 14 and are modulated to analog by a modem, not shown, to analog. As above, the analog signals can be in the range of 1 kHz-5 kHz and can encode the data and other information in accord with proprietary or industry standards. In the illustrated embodiment, by way of non-limiting example, the analog signals are FSK signals in accord with the standard FoxComm™ or HART™ protocols.

The analog signals received from the control device 14 are graphically depicted by waveform 14a. These signals are passed through a band pass filter 36 when the control device 12 is not generating and transmitting control signals and, thus, when the illustrated Transmit Enable signal is not asserted. The band pass filter 36 removes frequency components of the analog device signals outside the range 1 kHz-15 kHz and, preferably, outside the range 3 kHz-12 kHz. This has the effect of removing noise from the signal.

The filtered analog device signals are subsequently used to modulate the amplitude of a carrier signal. Any carrier signal can be used for this purpose. However, in the illustrated embodiment, by way of non-limiting example, the output of the modulator 22 is used. To this end, the modulator 22 is set to a fixed duty cycle during periods when the control device 12 is not generating and transmitting control signals across the isolation barrier 20. Any duty cycle can be used, though, in the illustrated embodiment, a duty cycle of 20%-80% and, preferably, approximately 50% is used. At this latter value, by way of example, the modulator 22 generates a 1 MHZ signal whose pulses have a width equal to 50% of the pulse period. This signal is, of course, inductively transferred over the barrier 20 by the transformer 18', thereby, permitting its use as a carrier, when the control device 12 is not generating and transmitting control signals.

Modulation of the carrier amplitude to encode the field device's (or transmitter's) FSK signal can be achieved in any manner known in the art. In a preferred embodiment, by way of non-limiting example, it is accomplished by multiplying or logically AND'ing the FSK device signal with the carrier, i.e., the modulator output, using AND gate 38. The resulting amplitude modulated signal, which is graphically represented by waveform 38a, is applied to the transformer 18" for inductive transfer over the barrier 20 to the control side.

Like transform 18', transformer 18" comprises any transformer or other combination of devices suitable for inductive transfer over the isolation barrier. This can be a transformer of the type conventionally used in the process and other control arts for such purpose, again, however, smaller, less expensive and using less power than transformers traditionally used to carry FSK signals across an isolation barrier. By way of non-limiting example, transformers suitable for the inductive transfer of the amplitude modulated device signals have inductance in the range of 600 µH-700 µH and, more preferably, 750 µH-900 µH and, still more preferably, 1000 µH-1500 µH. Suitable such transformers 18" of the type available, by way of non-limiting example, from the same sources as transformer 18'

Amplitude modulated device signals inductively transferred by the transformer 18" across the isolation barrier 20 are graphically depicted by wave 38b in the drawing. This signal is demodulated back into analog FSK form in any manner, proprietary or otherwise, known in the art. In the illustrated embodiment, by way of non-limiting example, this is accomplished through use of an envelope detector 40 with a time constant of between 1 µS and 2.5 µS and, preferably 1.5 µS. A preferred envelope detector comprises an capacitor of 220 pf and a resistor 6.81 kÙ configured as shown. Those skilled in the art will appreciate that capacitors and resistors of other values may be utilized to achieve the desired time constants.

The resulting analog signal, encoding the data and other information from the original device signal, is depicted by waveform 40a. This can be applied directly to the control device 12, via modem or otherwise.

In the illustrated embodiment, modems 16', 16", pulse width modulator 22 are embodied in a communications controller applications specific integrated circuit 42, which includes circuitry for performing other communications functions as well. That element 42 is referred to, alternatively, as the "ASIC" or "CommControl ASIC" in the text below. Those skilled in the art will, of course, appreciate that the invention can be implemented in other form factors, whether hardware or software, and with circuit element different than those shown in the drawing and described below.

The CommControl ASIC, as well as one or more other components illustrated in FIGS. 2 and 3 (apart from controller 12 and field device 14) can be embodied in any variety of input/output circuits utilized to communicate between process, environmental or other control devices. Such circuits can be integral with any such a control device (e.g., a controller) or embodied in a separate communication device. In the illustrated embodiment the ASIC and aforementioned components are embodied in an input/output module that is electrically coupled to, but physically separate from, the control devices 12 and 14. Such module is designated by the grayed regions of FIGS. 2 and 3.

The illustrated input/output module includes, in addition to the circuitry discussed above, circuitry that transfers power across the isolation barrier to drive the field side of the input/output module as well as to drive the field device 14 (and associated transmitter) itself. Such power circuitry is illustrated in the drawing as including a DC/DC converter, a transformer and a rectifier, all coupled in the manner shown and configured and operated in the manner conventional to the art. It will, of course, be appreciated that any other power transfer circuitry known in the art may be used for this purpose.

The illustrated input/output module includes additional circuitry that converts and transfers to the controller 12 a digital signal generated from the 4-20 mA current signal communicated between the input/output module and the field device 14. That current signal is traditionally referred to as the "analog" component of a FoxComm™ or HART™ signal, but shall be referred to a "current signal" to avoid confusion with the FSK component (which is traditionally but somewhat erroneously referred to as a "digital" signal, but which shall continue to be referred to as an analog signal elsewhere herein). The additional circuitry includes an A/D converter, which converts the current signal to digital for transfer across the isolation barrier via the optical isolator (comprising a photo diode and transistor opposed across the barrier). The digital signal is routed to a processor local to the input/output module, which can format the signal for transfer to the controller 12. In addition to providing the aforementioned function, the processor coordinates and control operations of the other components of the input/output module, all in the manner traditional in the art.

While the circuitry described immediately above converts and transfers to the controller 12 a digital signal generated based on the milliamp current signal from the field device 14, those skilled in the art will appreciate that corresponding circuitry (not shown) can be provided to transfer a milliamp current to the field device from controller. Such corresponding circuitry utilizes a digital to analog converter and a voltage to current converter in place of the A/D converter of the illustrated circuit, all in the conventional manner.

Modem 16 and pulse width modulator 22 are discussed below in connection with the DUAL TONE feature of the ASIC. In the illustrated embodiment, this provides asynchronous FoxComm™ and HART™ communications through eight independent channels. High frequency pulse width modulation encoded transmission supports RF transformer galvanic isolation with minimal external circuit support and cost. In addition, ASIC 42 includes An 80186-compatible stored program microprocessor controller, which may be switched into slave mode to accommodate an external master controller and for external emulation during software development and debugging.

High speed synchronous serial communications capability through two independent HDLC channels.

Asynchronous serial communications capability through three UART devices (one is a standard console, and two are highly buffered "fastports").

Field Analog Digital Input and Output Controller (FIOC) interacts with intelligent external analog and digital circuits for measurement and control. The FIOC supports state-machine controlled SPI interfaces that need minimal microprocessor intervention. External I/O pin programmability enables one same CommControl ASIC to be used in connection with interface devices for a diversity of different hardware product types.

Support for additional external peripheral, such as an Ethernet controller.

Scan test capability for high fault coverage and reliability.

Figure 4A:
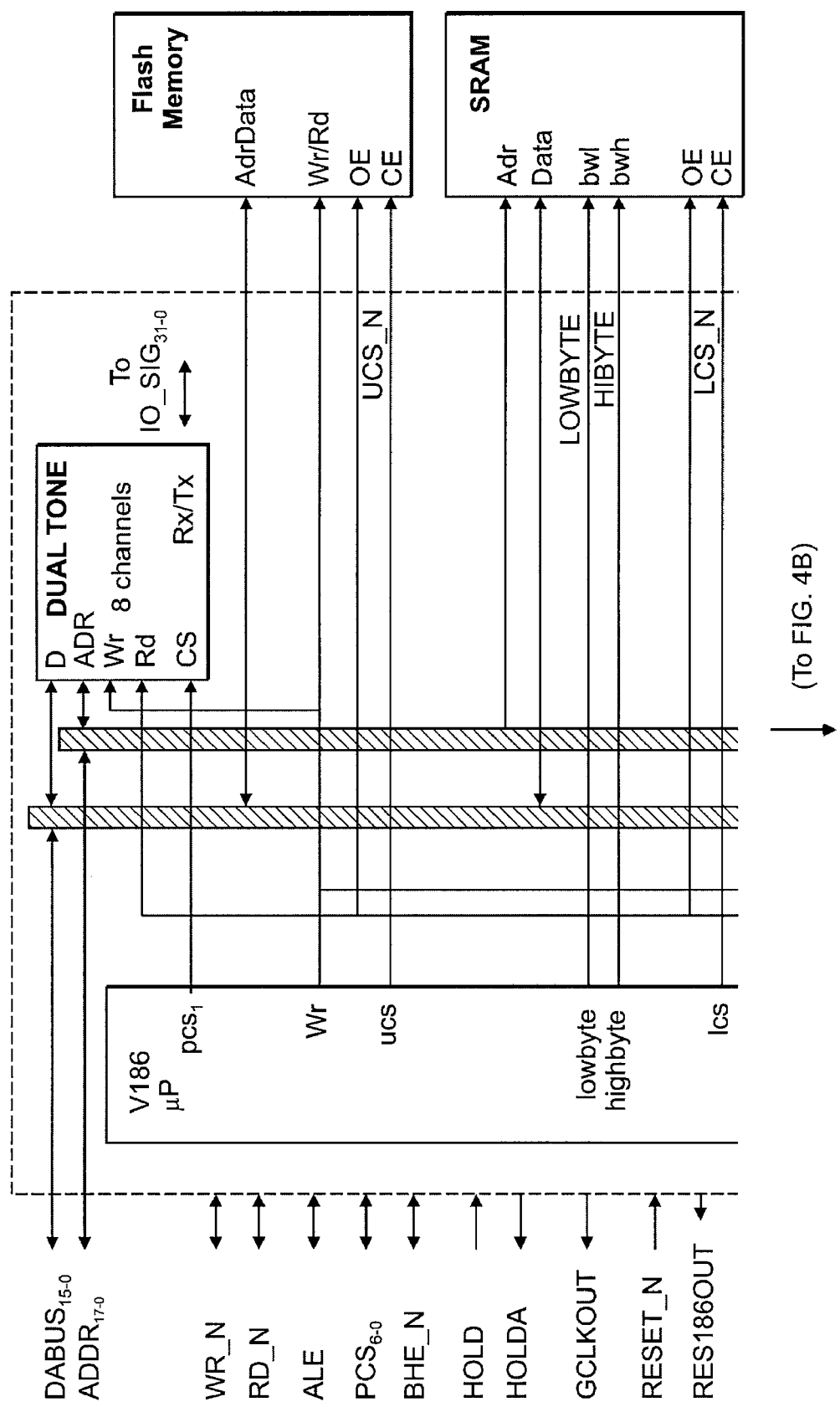
FIGS. 4A-4C depicts the architecture of an application specific integrated circuit (ASIC) embodying a communications system according to the invention.
Figure 4B:
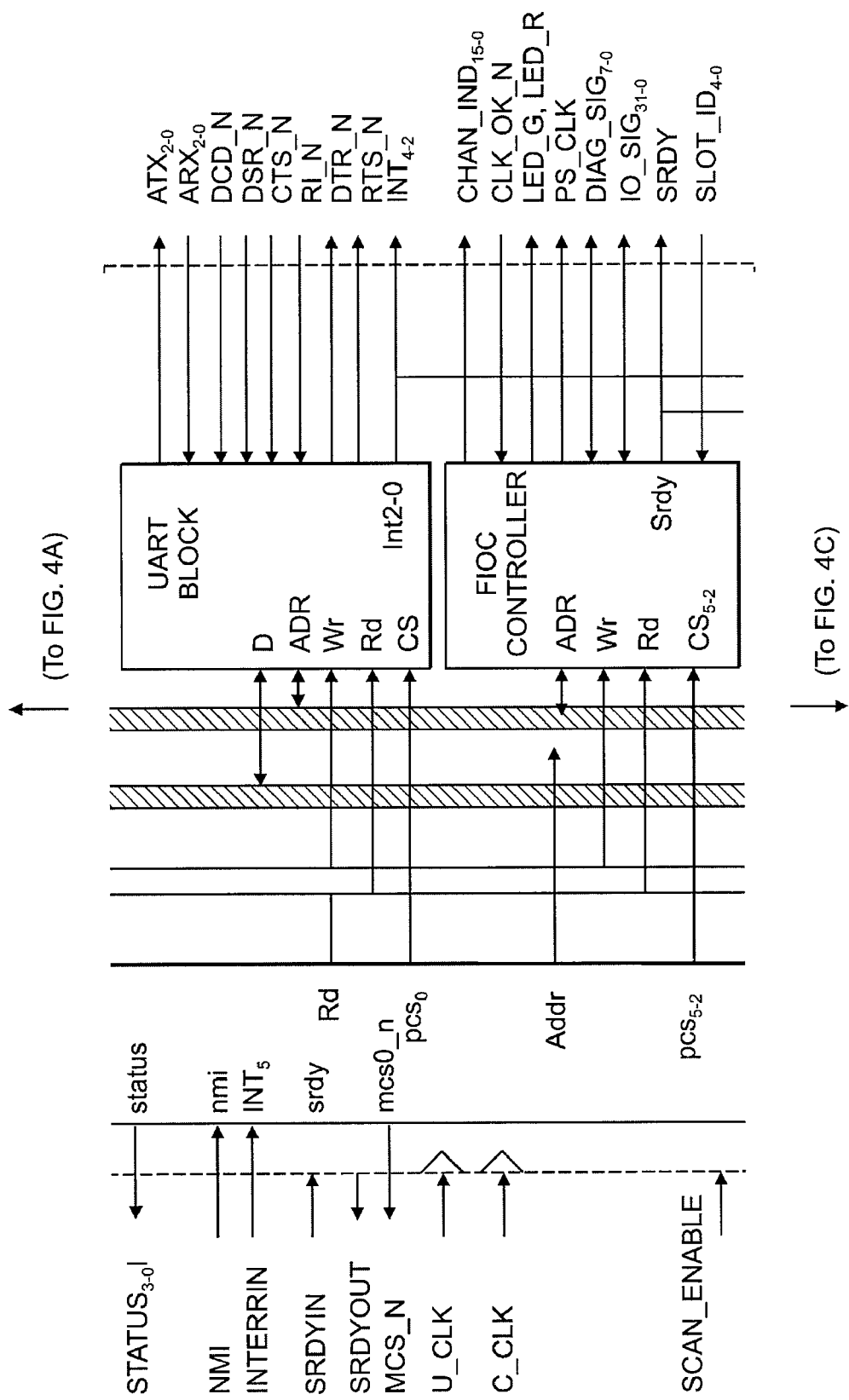
Figure 4C:
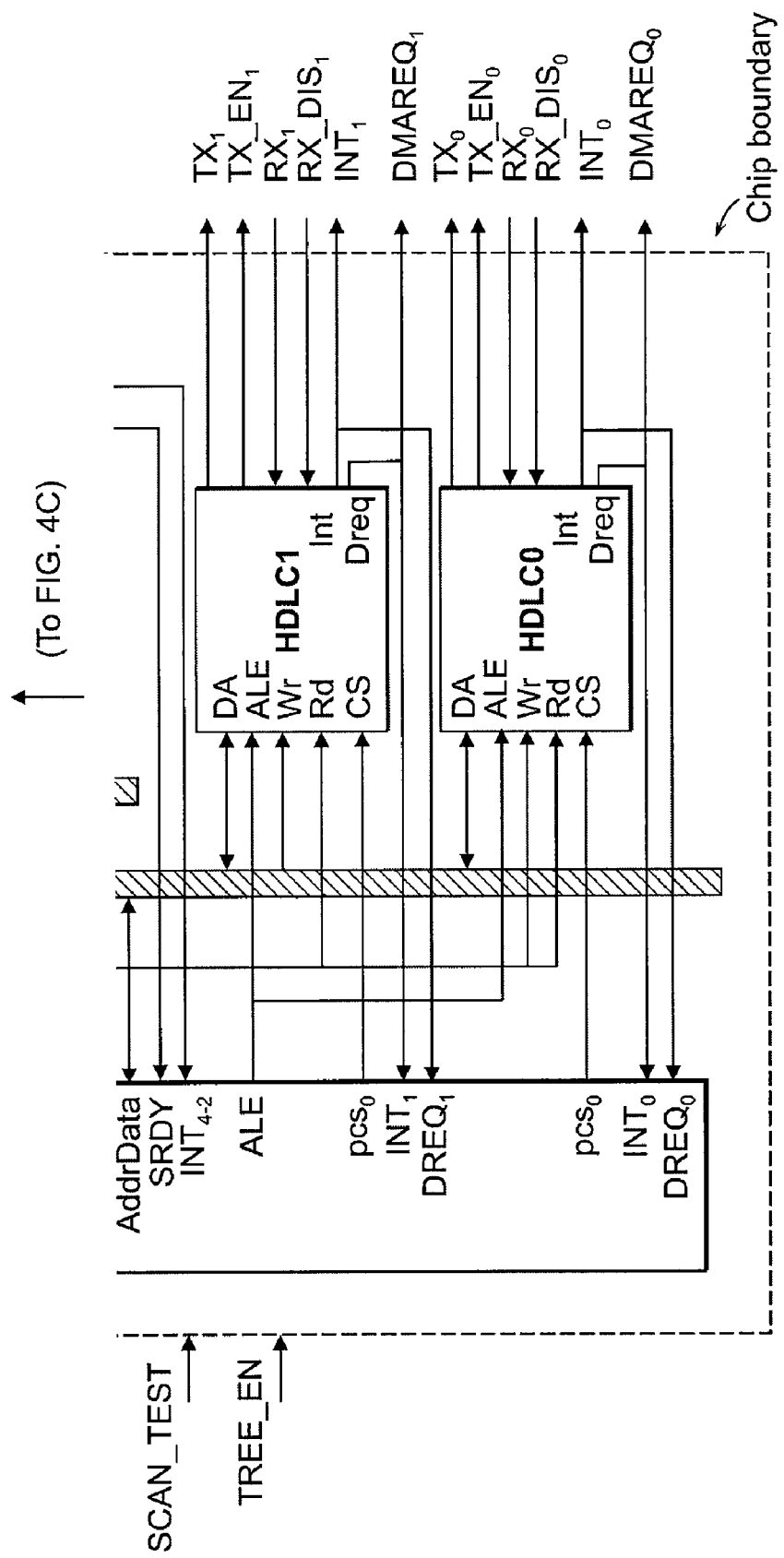

FIGS. 4A-4C illustrates the blocks that provide each of the foregoing functions. The HDLC, UART, DUAL TONE and FIOC blocks are peripherals in the IO space of the v186 microprocessor. Flash and SRAM memories are external to the ASIC. Building a process field bus module out of the ASIC requires external RS-244 drivers to connect to the HDLC wire, as well as appropriate external A/D and D/A converters for analog FBMs. External support circuitry is also required to handle the galvanic isolation and conversion between dual tone and pulse width modulated data in FoxComm and HART applications.

Building a basic hardware system with the CommControl ASIC 42 requires only two external memory blocks, one flash and the other one SRAM (the latter typically implemented in two ICs). The illustrated ASIC 42 is preferably used in connection with interface devices known as "Field Bus Modules" or "FBM"s (both, tradenames of the Assignee hereof), available from the Assignee hereof, though the ASIC 42 can be used with a variety of other process control devices and, more generally, control devices.

The two independent HDLC serial communication controllers (HSSC) provide high speed synchronous serial communications capability to the CommControl ASIC. They are referred as HDLC0 and HDLC1. Messages of arbitrary length (preferably in bytes) may be exchanged with a remote host. HDLC transfers typically occur under DMA control, leaving the microprocessor free to attend other tasks. Outgoing HDLC messages must be assembled first in external SRAM. For transmission, the HDLC controller makes DMA requests to the processor in order to fetch the message from memory. The controller interrupts the processor when the message transmission has been completed. For reception, the HDLC controller also makes DMA requests to the processor, in order to store the incoming message in external SRAM. The controller interrupts the processor when the message reception has been completed. DMA transfers support only half duplex operation. Other full duplex non-DMA transmission and reception modes are also available.

Each one of the three UARTs is a standard PC serial port peripheral. They are referred as UART0 (console), UART1 and UART2 ("fastports"). Of these, only the console is equipped with a full set of modem signals. The fastports are designed for maximum software efficiency, while retaining compatibility with the industry standard PC serial port specifications. Each UART may assert an independent interrupt signal. In the console UART, both transmitter and receiver have a sixteen position FIFO for data buffering. The fastports have a sixty four position FIFO in both transmitter and receiver. The UARTs are general purpose devices, and UART1 and UART2 are intended for fast local inter-board communication in double and triple redundant modules.

There are eight independent DUAL TONE FoxComm/HART asynchronous communication controllers. They are referred as ASYN0, ASYN1, . . . ASYN7. Their inputs and outputs are routed through any of the 32 general purpose IO_SIG pins, as configured in the IO PIN Control Register. Each controller consists of a transmitter and a receiver. The transmitter consists of an asynchronous device with a sixteen position FIFO to store data bytes that are converted into serial frames flanked by a start and a stop bit. The frames are fed to a dual tone modulator. The resulting dual tone FSK signal is fed to a Pulse Width Modulator (PWM). Either the serial frames, the FSK or the PWM signals may be transmitted out. The receiver consists of an FSK dual tone demodulator, which converts FSK into asynchronous serial bit frames. The asynchronous serial frame is fed to a serial receiver that stores the received bytes in a 32 position FIFO. In both cases, the dual FSK tone may be programmed to conform to either the FoxComm I (IT1), the Fox-Comm II (IT2) or the HART protocol. The controllers may be selected to receive either FSK dual tone, or asynchronous serial frames (the latter is equivalent to a UART). The PWM option is intended to support small size high frequency external electromagnetic transformers for galvanic isolation.

The FIOC is a programmable peripheral capable of handling digital and analog input and output for process control. It is fully configurable, and interacts with external devices through a set of 32 programmable IO pins. The FIOC communicates with external devices using an SPI protocol. The SPI transactions may be placed under the control of dedicated state machines thus leaving the internal microprocessor free for other tasks. In addition, it offers status LED control, watchdog timeout and fail-safe protection.

The 80186 compatible microprocessor (B186) is a stored-program 16-bit microprocessor, with two DMA and six interrupt channels, three programmable timers, SRAM and PROM select decoding, and up to seven peripheral chip select decoding. The microprocessor is fully integrated inside of the ASIC. The V186 interacts with external SRAM and PROM for instruction fetching and storage. A more complete understanding of the V186 may be attained by reference to "Microsystem Components Handbook", Intel Corporation, Santa Clara, Calif. 1985, chapter 3. Also "V186 Synthesizable HDL Core Specification and Data Sheet", Rev 1.6 V Automation Inc., Nashua, N.H., 1988. Also "V8086 Synthesizable HDL Core Specification and Data Sheet", Rev 1.8 V Automation Inc., Nashua N.H., 1988, the teachings of all of which are incorporated herein by reference.

The ASIC may be operated in two different processor modes. In the normal (master) mode, the internal v186 is in control of the HDLC, UARTs, DUAL TONE and FIOC peripherals, and the bus signals are brought out for memory transactions and also for visibility. In the alternate (slave) mode, the internal v186 is turned off line (by asserting the HOLD pin high), and the HDLC, UARTs, DUAL TONE and FIOC peripherals are under the control of an external bus master for emulation, debugging and diagnostics.

The operation mode is selected with the HOLD input pin. For normal (internal master) mode, the HOLD pin must be either low or open. For external v186 (slave) mode, the HOLD pin must be high.

The ASIC may be operated in two different processor modes. In the normal (master) mode, the internal v186 is in control of the HDLC, UARTs, DUAL TONE and FIOC peripherals, and the bus signals are brought out for memory transactions and also for visibility. In the alternate (slave) mode, the internal v186 is turned off line (by asserting the HOLD pin high), and the HDLC, UARTs, DUAL TONE and FIOC peripherals are under the control of an external bus master for emulation, debugging and diagnostics. The operation mode is selected with the HOLD input pin. For normal (internal master) mode, the HOLD pin must be either low or open. For external v186 (slave) mode, the HOLD pin must be high.

Characteristics of the ASIC 42 are overviewed in the table below:

| CONCEPT | CHARACTERISTIC | COMMENTS |
| --- | --- | --- |
| CLOCK RATES | Microprocessor: Nominally 20 MHz | The U_CLK pin drives the internal microprocessor clock. Its minimum frequency is 16 MHz. May be run at higher frequency. |
| | HDLC 2 MHz | The C_CLK pin drives the HDLC controller, and DUAL TONE logic. Its nominal frequency is 16 MHz, which is divided internally by 8 to achieve 2 Mbit/sec. An 8.6 MHz clock may be used instead for 268.75 Kbit/second HDLC (divide by 32). |
| INTERNAL PROCESSOR | Compatible with INTEL 80186. | Internal processor may be disabled to allow use of an external processor for emulation, debugging, test, or even normal operation. Addressing capability is up to 20 bits (up to 1 Mbytes of SRAM and 1 Mbytes of ROM). |
| DIGITAL/ANALOG IO PINS | Fully configurable. | Software-programmable as inputs/outputs, with or without logic inversion. Pins have full matrix connectivity to select any internal digital/analog blocks, as well as DUAL TONE blocks. |
| WATCHDOG TIMEOUT | Bit must be toggled at least every 60 msec. | If processor fails to toggle watchdog keep alive bit, it will be reset. |
| FAIL SAFE PROTECTION | If enabled, analog and digital outputs go to a pre-defined condition. | Caused by watchdog timeout or by control processor command. |
| STATUS AND CHANNEL LED INDICATOR SIGNALS | "Red and green" LED signals to indicate the operational status of the module. LED signals to indicate channel on-off status. | |
| HDLC | Two independent HDLC controllers. | Point to point only. No SDLC loop mode. The speed is nominally 2 Mbit/sec, with other options possible. Supports block DMA communications. |
| PROCESSOR INTERRUPTS | (INT)4-0 used by internal peripherals in fully nested interrupt mode. $INT_5$ available for external device. | Interrupt lines support the DMA transmission and reception of HDLC messages. The interrupts occur upon the reception of a whole message into memory, or after the transmission of a whole message out from memory. Also UARTs may interrupt processor. |
| PROCESSOR DMA | DREQ0 and DREQ1 | DMA request signals support DMA block transmission and reception of HDLC frames. The processor is not burdened during the HDLC transfers. |

-continued

| CONCEPT | CHARACTERISTIC | COMMENTS |
|---|---|---|
| CONSOLE SERIAL PORTS | Three independent UARTs. | One industry standard PC serial port UART with full set of modem signals, to be used as a console, or to support an infrared port. Two other "fastport" UARTs without modem signals, designed for compatibility plus software efficiency for inter-board communication. |
| FOXCOMM/ HART | Eight independent channels. | Inputs and outputs fully configurable. Supports high frequency PWM to drive small external RF transformers. May be operated as simple UART. |

Pinouts of the table are presented in the table below:

| NAME | IO | INT(1) RES | DESCRIPTION |
|---|---|---|---|
| (ADDR)$_{19-0}$ | IO | | Address. Memory and IO address for an address space of 1M bytes. It is an output for normal (internal v186) mode, and its (least significant eight bits (ADDR)7-0( ) are an input for external) v186 mode. |
| ALE | IO | | Address Latch Enable. When asserted high, the contents of the DABUS are latched into the internal address latch. It is an output for normal (internal v186) mode, and an input for external 186 mode. |
| (ARX)$_{2-0}$ | I | UP | Asynchronous Receive. Pins with subindex 0, 1 and 2 are the serial data inputs for UART0 (console), UART1 and UART2, respectively. |
| (ATX)$_{2-0}$ | O | | Asynchronous Transmit. Pins with subindex 0, 1 and 2 are the serial data outputs for UART0 (console), UART1 and UART2, respectively. |
| BHE_N | IO | | Byte High Enable. Asserted low for byte bus transactions in the high byte of a 16-word (odd byte address). It is an output for normal (internal v186) mode, and an input for external v186 mode. |
| C_CLK | I | | Communications Clock. This is the clock that drives the HDLC channels and DUAL TONE block. It is nominally 16 MHz. |
| (CHAN_IND)$_{15-0}$ | O | | Channel Status Indicators. Used to control external channel LEDs. See Table VII.3 on page107. |
| CLK_OK_N | I | | Clock OK. Normally low. When high it forces LED_G low (green LED turns off) and LED_R high (red LED turns on), even if the master clock U_CLK has stopped. |
| CTS_N | I | UP | Clear To Send. Modem input to console UART. Asserted low. |
| (DABUS)$_{15-0}$ | IO | UP | Data-Address Bus. Bidirectional multiplexed address and data bus. The LSB corresponds to the LSB of internal registers. |
| DCD_N | I | UP | Data Carrier Detect. Modem input to console UART. Asserted low. |
| (DIAG_SIG)$_{7-0}$ | IO | DOWN | Input/Output Signals. These signals are used for discrete input and output diagnostics. |
| (DMAREQ)$_{1-0}$ | O | | DMA Request. A high in either of these signals indicates a DMA request posted by their corresponding HDLC. In normal (internal v186) mode, these signals echo internal activity and may therefore be used for testing. In external v186 mode, these signals must be connected to the corresponding external microprocessor inputs. |
| DSR_N | I | UP | Data Set Ready. Modem input to console UART. Asserted low. |
| DTR_N | O | | Data Terminal Ready. Modem output from console UART. Asserted low. |
| GCLKOUT | O | | General Clock Out. The output signal on this pin is program selected from several internal sources in the SYSTEM REGISTER (see Table I.5). The sources are the console and UART1 UART2 baud clocks, or the HDLC DPLL clocks. |
| HBYTES | O | | High Bytes. Used to select the high byte external SRAM. Asserted high. |
| HOLD | I | DOWN | Hold. When asserted high, the internal v186 is forced into hold (slave) mode, stopping the program execution. All the relevant v186 microprocessor pins change direction, allowing an external microprocessor to become bus master. This signal has an internal pulldown, and must be held low (or left open) during normal operation. |
| HOLDA | O | | Hold Acknowledge. Asserted high when internal v186 acknowledges the HOLD pin request, and relinquishes the bus to an external master. |

-continued

| Signal | I/O | Pull | Description |
|---|---|---|---|
| (INT)4-0 | O | | Interrupt Request. A high in either of these signals indicates an interrupt request by their corresponding HDLC or UART blocks (see Table I.4). In normal (internal v186) mode, these signals echo internal activity and may be therefore used for testing. In external 186 mode, these signals must be connected to the corresponding external microprocessor inputs. |
| INTERRIN | I | DOWN | Interrupt Input. This input drives the internal v186 INTERRUPT 5 input. May be used by any peripheral exernal to the ASIC (such as an Ethernet controller) to interrupt the internal processor. |
| (IO_SIG)$_{31-0}$ | IO | DOWN | Input/Output Signals. These are the signals used to talk and listen to external digital and analog input and output devices. They are also used for FoxComm and HART. These signals are software-configurable, and maybe routed to any of the internal digital and analog blocks in the ASIC. See "PIN MULTIPLEX CONTROLLER" on page103. |
| LBYTES | O | | Low Bytes. Used to select the low byte external SRAM. Asserted high. |
| LCS_N | OZ | | Low Chip Select. This signal is asserted low whenever a memory reference is made to the lower memory portion of the address space. Drives the external SRAM chip select. High impedance in external 186 mode. |
| LED_G | O | | Green LED. This signal is asserted high to turn on the external green LED. |
| LED_R | O | | Red LED. This signal is asserted high to turn on the external red LED. |
| MCS_N | OZ | | Memory Chip Select. This signal is asserted low to select an external memory device (such as an Ethernet controller). It is driven by the internal v186 MCS0_N output. This pin is at high impedance in external 186 mode. |
| NMI | I | DOWN | Non Maskable Interrupt. This signal is asserted high to make a non-maskable interrupt request to the internal v186. Must be held low (or left open) during normal operation. |
| (PCS_N)$_{6-0}$ | IO | | Peripheral Chip Select. These signals are asserted low to select the internal peripherals, pcs0 selects HDLC0, HDLC1, the system register, console, UART1 and UART2. pcs1 selects the DUAL TONE block. pcs2 selects AIOCB0, pcs3 selects AIOCB1, pcs4 selects the pin configuration and discrete I/O registers. pcs5 selects the pulse counter circuit logic. Pin pcs6 does not select any internal peripherals, and is intended for selecting any future (external peripherals. Pins pcs)5-0 are outputs for normal master (internal v186) mode, and inputs for external 186 (slave) mode, since they must be driven by the equivalent pins in the external microprocessor. Pin pcs6 is a tristate output. |
| PS_CLK | O | | Power Safe Clock. A constant frequency (400 KHz nominal) is always present on this pin while the chip is powered up. Otherwise, power has been removed from the chip, or a chip failure has occurred. Derived from U_CLK by a programmable divide constant (see Controls Power supply clock rate Table VII.3). |
| RD_N | IO | | Read. Asserted low during a read cycle. It is an output for normal (internal v186) mode, and an input for external 186 mode. |
| RESET_N | I | | Master Reset. Assert this signal low to initialize the chip into a known state. The pin must be held asserted at least four U_CLK cycles for proper initialization of the v186 microprocessor. |
| RES186OUT | O | | Reset Out. This signal becomes asserted high during any internal v186 reset (this may be due to a watchdog timeout). This signal also echoes assertions of the reset_n input. Alternatively, if TREE_EN is high, this becomes the output pin for the NAND tree test circuit. |
| RI_N | I | UP | Ring Indicator. Modem input to console UART. Asserted low. |
| RTS_N | O | | Request To Send. Modem output from console UART. Asserted low. |
| (RX)1-0 | I | | Receive. Pins with subindex 0 and 1 are the serial data inputs for HDLC0 and HDLC1 respectively. |
| (RX_DIS)1-0 | O | | Receiver Disable. Pins with subindex 0 and 1 are asserted high to turn off the external receive buffer corresponding to HDLC0 and HDLC1 respectively. |
| SCAN_ENABLE | I | DOWN | Scan Enable. Must be tied low (or left open) during normal operation. This pin is only driven high during scan test, in order to enable the flip flop scan chain, and to shift in serially a set of flip flop states. A one clock evaluation is performed with this pin low. This is followed by forcing this pin high again, to shift out the resulting states for test analysis. |
| SCAN_TEST | I | DOWN | Scan Test. This pin must be tied low (or left open) during normal system operation. This pin is set high during scan test of the ASIC. This forces the internal flip flops to be driven by their respective scan domain clock (C_CLK or U_CLK). It also forces |

-continued

| | | | | |
|---|---|---|---|---|
| | | | | all bidirectional pins as outputs, eliminates all internal loops, and removes the effect of internal signals on flip flop direct set and clear. |
| (SLOT_ID)$_{4-0}$ | I | UP (low Ù) | | Slot Identification. Intended for hard-wiring a 5-bit code that identifies the printed circuit board environment and intended use of the ASIC. This code may be read by the microprocessor. See TableVII.3 on page107, Config/Status. |
| SRDYIN | I | UP | | Synchronous Data Ready Input. When this input is deasserted low, it causes the internal 186 to extend its memory cycle. In addition, the SRDYOUT pin is also deasserted low. This pin must be kept high or left open for normal operation. To be used by an external peripheral that requires extended memory cycles. |
| SRDYOUT | O | | | Synchronous Data Ready Output. This output is deasserted low for as long as an internal peripheral requires the microprocessor to extend its memory cycle. It is also deasserted low if the SRDYIN input is deaaserted low. Connect this pin to the SRDY pin of an external 186 whenever the ASIC is used in external 186 mode. |
| (STATUS)$_{3-0}$ | OZ | | | Microprocessor Status. Indicates the state of the internal v186 microprocessor. The code is detailed in Table I.3. High impedance in external 186 mode. |
| TREE_EN | I | DOWN | | Tree Scan Enable. Must be tied low (or left open) during normal operation. Assert this pin high to observe NAND tree test output in RES186OUT. |
| (TX)$_{1-0}$ | O | | | Transmit. Pins with subindex 0 and 1 are the serial data outputs for HDLC0 and HDLC1 respectively. |
| (TX_EN)$_{1-0}$ | O | | | Transmit Enable. Pins with subindex 0 and 1 are asserted high to turn on the external transmitter driver corresponding to HDLC0 and HDLC1 respectively. |
| U_CLK | I | | | Microprocessor Clock. This is the master clock. It drives the internal v186 microprocessor, as well as other IO components. It is nominally 20 MHz. This clock's frequency must be greater or equal than the frequency at the C_CLK pin. |
| UCS_N | OZ | | | High Chip Select. This signal is asserted low whenever a memory reference is made to the upper memory portion of the address space. Drives the external FLASH chip select. High impedance in external 186 mode. |
| WR_N | IO | | | Write. Asserted low during a write cycle. It is an output for normal (internal v186) mode, and an input for external 186 mode. |

I. Internal pullup or pulldown resistor.

| S3 | S2 | S1 | S0 | CODE |
|---|---|---|---|---|
| X | 0 | 0 | 0 | Interrupt Acknowledge |
| X | 0 | 0 | 1 | Read I/O |
| X | 0 | 1 | 0 | Write I/O |
| X | 0 | 1 | 1 | Halt |
| X | 1 | 0 | 0 | Instruction Fetch |
| X | 1 | 0 | 1 | Memory Read |
| X | 1 | 1 | 0 | Memory Write |
| X | 1 | 1 | 1 | Idle |
| 0 | X | X | X | Processor Cycle |
| 1 | X | X | X | DMA Cycle |

| INTERRUPT | DEVICE |
|---|---|
| INT$_5$ | Available for external device. |
| INT$_4$ | UART2 |
| INT$_3$ | UART1 |
| INT$_2$ | UART0 (Console) |
| INT$_1$ | HDLC1 |
| INT$_0$ | HDLC0 |

Figure 5:
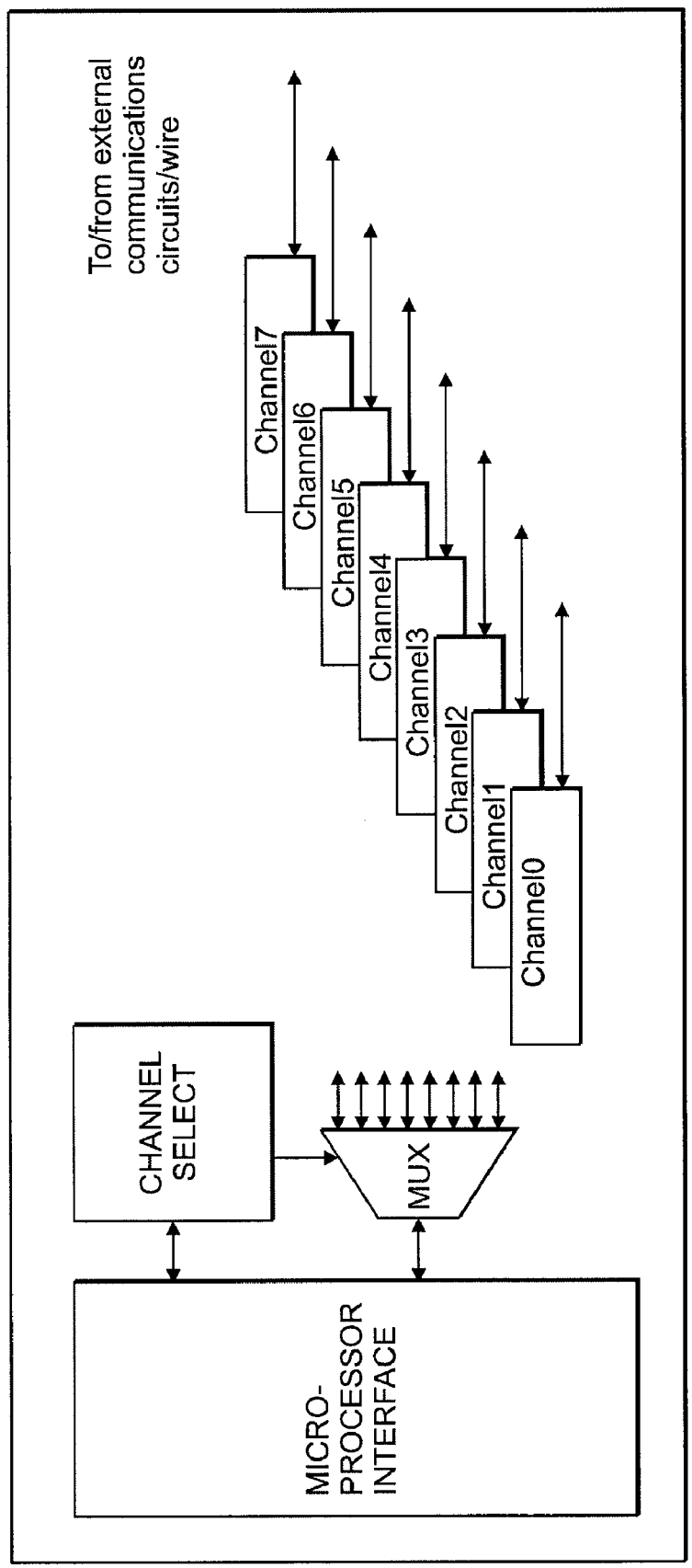
FIG. 5 depicts a dual tone asynchronous block of the ASIC of FIGS. 4A-4C.

The Dual Tone Asynchronous Serial Communication block (DTASC) of FIG. 4A is a computer peripheral capable of transmitting and receiving data bytes asynchronously as a serial-bit message. The message may be encoded in either of three signal encoding formats: NRZ bit frames, dual tone frequency shift keying (which may be used for example with the well-known Fox-CommI™, FoxCommII™ or HART protocols), and high frequency pulse width modulated (PWM) signal (transmission only). The block contains eight identical channels, as illustrated in FIG. 5, each of which may be independently programmed to operate in any of the aforementioned signal formats. The block contains a register set similar to a UART, but with no interrupt or modem handshake signal support.

The DTASC block contains eight identical and independent Dual Tone channels. Each channel may be programmed independently for FoxComm™ (IT1-IT2) or HART communications. 1 MHz Pulse Width Modulation (PWM) transmission supports external high frequency transformer isolation circuitry for both transmission and reception. The block has trapezoidal dual tone smoothing effect built into PWM transmission which adheres to HART specifications. Data may be transmitted as either asynchronous serial frame NRZ, dual tone, or modulated pulse width. Data may be received as dual tone, or serial frame NRZ. The transmitter is buffered with a 8 byte deep FIFO. Receiver is buffered with 16 byte deep FIFO. The block provides polled-based communication, with no interrupt support. A programmable baud generator divides input clock frequency for baud rates between $\frac{1}{16}$ and 212. The block is fully programmable: 5-8 bit characters; even, odd or no parity; and, one or two stop bits. The block permits break generation and detection. The transmitter automatically adds and receiver automatically removes start, parity and stop bits. The block supports full duplex NRZ communications, as well as half duplex dual tone and PWM communications. System loopback mode is available for testing all eight channels, each channel transmitting to another channel and receiving from another channel.

Frame Format

Figure 6:
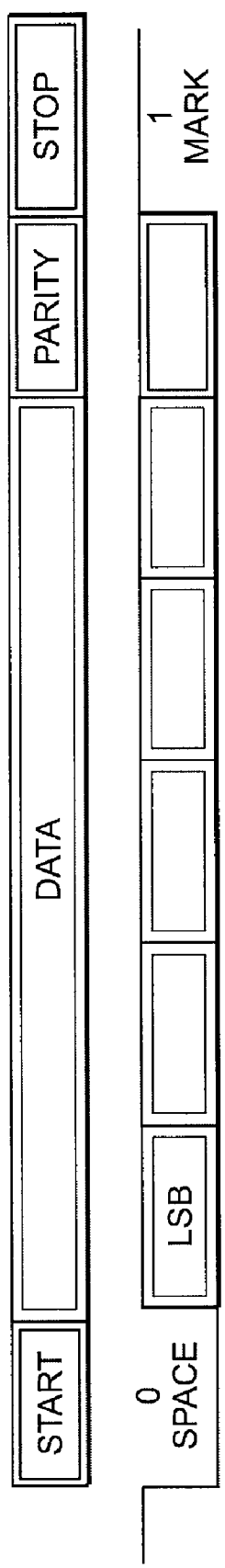
FIG. 6 depicts an asynchronous frame supported by the dual tone asynchronous block of FIG. 5.

Referring to FIG. 6, for each of the three formats supported by the DTASC, the message unit is the bit-serial frame, which conveys from five to eight bits of information, plus optional parity bit. The frame consists of a start bit. The start bit (MARK) is immediately followed by the data bits (between five to eight) LSB first. These are followed by an optional parity bit (either even, odd or stick parity). The frame ends with a stop bit (SPACE).

Signal Format

Nrz Format

In this format a zero bit is represented by a low (SPACE) signal, and a one bit is represented by a high MARK). Thus the signal is merely an unencoded flame, as shown in FIG. 6.

Dual Tone Fsk Signal Encoding

The block supports three dual tone FSK formats: Fox-CommI™, FoxCommII™ and HART. A dual tone FSK signal represents a zero or one bit with either a low or a high frequency tone (digital square wave). The bit data rate and tone frequencies are listed in the table below:

| MODE | BAUD RATE (Hz) | NOMINAL MARK FREQUENCY - NRZ ONE (Hz) | NOMINAL SPACE FREQUENCY - NRZ ZERO (Hz) |
|---|---|---|---|
| FoxComm I (IT1) | 600 | 5,208 | 3,125 |
| FoxComm II (IT2) | 4800 | 10,417 | 6,250 |
| HART | 1200 | 1,200 | 2,200 |

Effective peak to peak rise and fall time: 133 μsec

Figure 7:
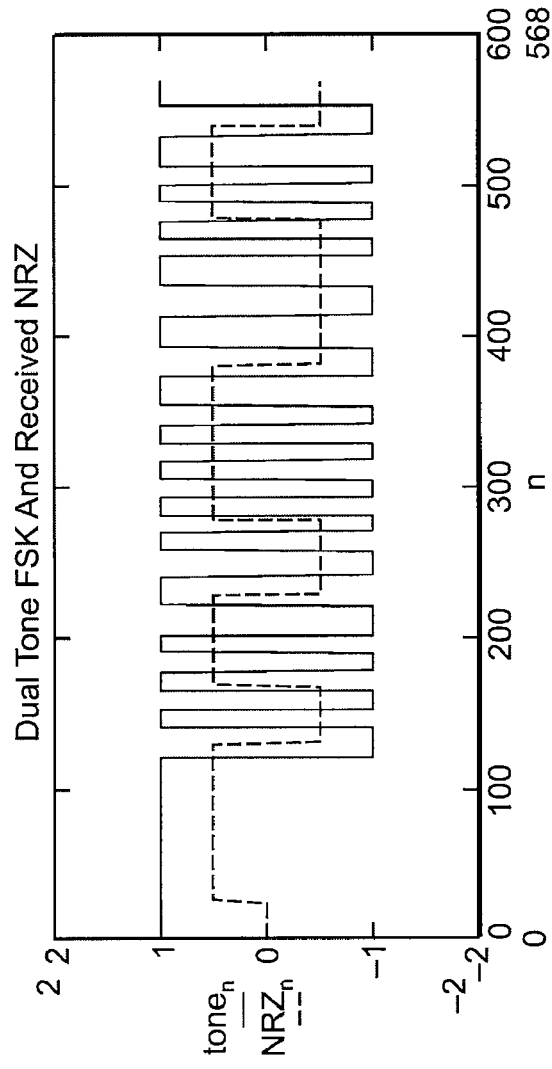
FIG. 7 depicts a relationship between NRZ and dual tone FSK as supported by the dual tone asynchronous block of FIG. 5.

The relationship between NRZ and dual tone FSK is illustrated in FIG. 7.

Pulse Width Modulated Signal Encoding

The PWM signal encoding is supported only for transmission. The intention of this format is to provide a high frequency encoded signal to drive external transformers for galvanic signal isolation. The high frequency reduces the size of the transformers, and results in more efficient external support circuitry. The dual tone FSK itself modulates the PWM, so that the FSK will be available after demodulating the signal in the secondary of the external transformer for remote transmission.

Figure 8:
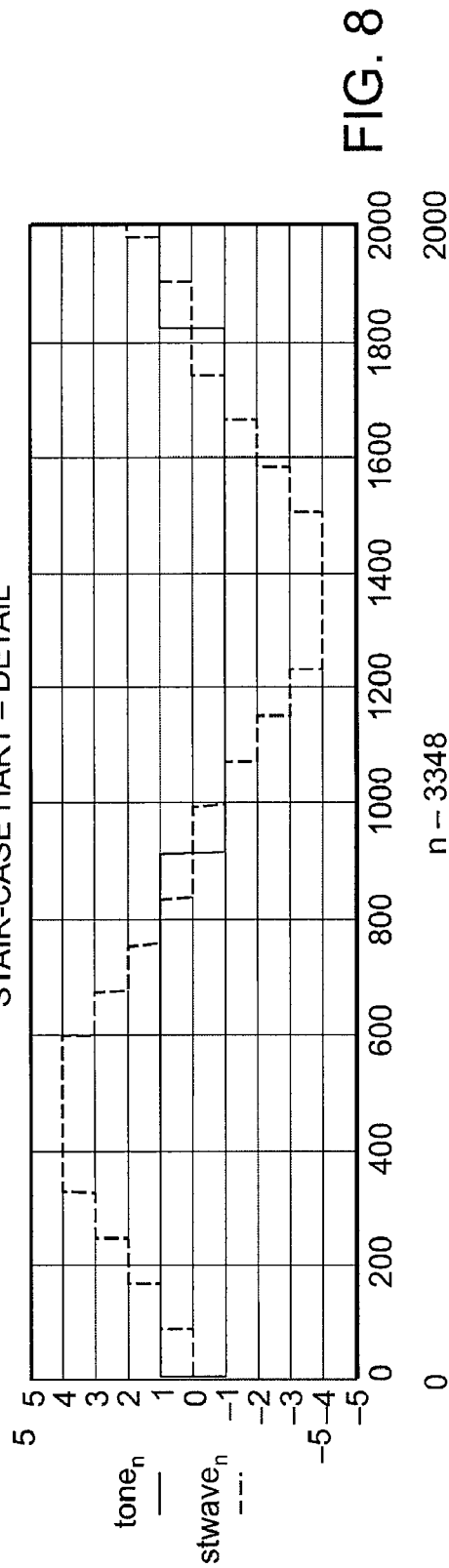
FIG. 8 depicts a Hart dual tone signal of the type generated by a dual tone asynchronous block of FIG. 5.

The PWM has a basic 1 MHz frequency (1 μs period). The signal "on time" during this period is modulated within the range of $$\left(\frac{1}{2} \pm \frac{3}{16}\right) \mu s = \left[\frac{5}{16}, \frac{11}{16}\right] \mu s \text{ in } \frac{1}{16} \mu s$$

increments to encode the FSK. This results in a duty cycle of 50%±6.25% increments. Dual tone valleys are encoded with a lower "on time", and dual tone peaks are encoded with a higher "on time". In IT1 and IT2 modes, the PWM transitions vary abruptly from 31.25% to 68.75% duty cycle. In HART mode, the PWM transitions are encoded with a "staircase" trapezoidal dual tone signal, so that the "on time" changes in three discrete steps either above or three discrete steps below the "unmodulated" 50% duty cycle signal. See FIG. 8.

Block Pinout

The DTASC block pinout is detailed in the table below:

| NAME | I/O | DESCRIPTION |
|---|---|---|
| (ADDR)$_{2-0}$ | I | Address. Used to encode the address of the internal control, status or data registers. |
| CLK4MHZ | I | Clock 4 MHz. This is the primary clock from which the baudrate is derived, as well as all other clocks that generate the dual tone. |
| CLK16MHZ | I | Clock 16 MHz. This clock is used to generate the PWM signal. |
| CS_N | I | Chip Select. Assert low to read or write the internal registers and data FIFOs. The block is not selected when deasserted high. |
| (DIN)$_{15-0}$ | I | Input Data Bus. Contains the 8-bit data to be written into the internal registers or transmit FIFO (bits D)7(-D)0( ). Bit 0 is the LSB, and corresponds to the internal registers' LSB. The width is sixteen bits to accomodate the Channel Select Register, whose byte data is at an odd address (the high byte of the corresponding 16-bit word). |
| (DOUT)$_{15-0}$ | O | Output Data Bus. Contains the 8-bit data read from the internal registers or receive FIFO. Bit 0 is the LSB, and corresponds to the internal register's LSB. The width is sixteen bits for a reason similar to DIN. |

-continued

| NAME | I/O | DESCRIPTION |
|---|---|---|
| HBYTE | I | High byte. Asserted high if a write transaction occurs in the high byte. |
| LBYTE | I | Low byte. Asserted high if a write transaction occurs in the low byte. |
| RD_N | I | Read. Must be asserted low to read out the contents of internal registers or the receive FIFO onto the output data bus DOUT. |
| READENABLE | O | Read Enable. Indicates to external drivers that the HSSC is driving the bus on a register or receive FIFO read. |
| RESET | I | Reset. Assert high to reset the internal logic to a known state. |
| (RXSD)$_{7-0}$ | I | Receiver Serial In. This is the block receiver serial input. |
| SYSLOOP | I | System Loop. Places all eight channels inside the block in loopback mode. |
| (TXON)$_{7-0}$ | O | Transmitter On. This pin is high if the transmitter is transmitting, low otherwise. This signal is low during system loopback. |

-continued

| NAME | I/O | DESCRIPTION |
|---|---|---|
| $(TXQ)_{7-0}$ | O | Transmitter Serial Out. This is the block's transmitter serial output |
| UCLK | I | Microprocessor Clock. This clock is typically equal or faster than 16 MHz, to interface the internal data FIFOs with a processor. |
| WR_N | I | Write. Must be asserted low to write the contents of the DIN bus into the internal registers or the transmit FIFO. |

Register Address Map

The register map of the DTASC is detailed in the table below. All register bits are cleared during reset, unless specified otherwise. Registers are sixteen bits wide, and are either byte or word addressable. The CHANNEL SELECT REGISTER and the RECEIVER AND TRANSMITTER DATA BUFFER REGISTER are typically regarded as two separate byte addressable registers. Data in the RECEIVER AND TRANSMITTER DATA BUFFER REGISTER is mapped to the high byte at DIN15-8 and DOUT15-8. Data in all other register's LSB is associated with the LSB of the I/O signals DIN7-0 and DOUT7-0.

The contents of the CHANNEL SELECT REGISTER determine the particular channel that is addressed when writing or reading any other registers. Therefore, in order to write or read a particular channel, its channel number must be first written into the CHANNEL SELECT REGISTER

| HEX ADDRESS | NAME | RW | BIT | DESCRIPTION |
|---|---|---|---|---|
| 0 | CHANNEL SELECT REGISTER | RW | $D_7$-$D_0$ | Write here a binary number to select the corresponding channel. Any subsequent write or read references to registers in the address range 1-6 refer to the selected channel.<br>Note: This is a byte wide register |
| 1 | RECEIVER AND TRANSMITTER DATA BUFFER REGISTER | RW | $D_7$-$D_0$ | Write at this location the data to be transmitted (LSB is first bit out). Read from this location the received data (First bit in is in LSB).<br>Note: This is a byte wide register |
| 2 | LINE CONTROL REGISTER (LCR) | W | $D_{15-13}$ | Reserved for Test. |
| | | | $D_{12}$ | Loopback. |
| | | | $D_{11}$ | Hysteresis. Set high to maximize hysteresis to recover the bit serial data from the continuous autocorrelator output. It is recommended to keep this bit high. |
| | | | $D_{10}$ | Reserved. |
| | | | $D_{9-8}$ | 11 Reserved<br>10 HART. Set high for HART communications - 1200 baud<br>01 FoxII. IT2 mode communications - 4800 baud.<br>00 FoxI. IT1 mode communications - 600 baud. |
| | | | $D_7$ | Integrate Dump. Set high to use integrate and dump circuit in the demodulator, instead of the continuous autocorrelation circuit. It is recommended to keep this bit low. |
| | | | $D_6$ | Set Break. Set this bit high to send a break (continuous mark). |
| | | | $D_5$ | Stick Parity. If 1, stick parity is enabled. With stick parity, frame parity bit is the logic complement of $D_4$. |
| | | | $D_4$ | Even Parity Select. If 0, odd parity, if 1 even parity. |
| | | | $D_3$ | Parity Enable. If 0, no parity bit in frame, if 1, parity bit in frame. The parity bit is determined from the settings of $D_5$-$D_4$. |
| | | | $D_2$ | Stop bits. If 0, one stop bit, if 1, two stop bits. |
| | | | $D_1$-$D_0$ | 11 Character size 8 bits<br>10 Character size 7 bits<br>1 Character size 6 bits<br>0 Character size 5-bits |
| 2 | LINE STATUS REGISTER (LSR) | R | $D_{10}$ | Frame In Progress. |
| | | | $D_9$ | Tone Detect. |
| | | | $D_8$ | Transmitter FIFO Full. |
| | | | $D_7$ | Error in Receiver FIFO. |
| | | | $D_6$ | Transmitter Empty. |
| | | | $D_5$ | Transmitter FIFO Empty. |

-continued

| HEX ADDRESS | NAME | RW | BIT | DESCRIPTION |
|---|---|---|---|---|
| | | | $D_4$ | Break Detect |
| | | | $D_3$ | Framing Error |
| | | | $D_2$ | Parity Error |
| | | | $D_1$ | Overrun Error. |
| | | | $D_0$ | Data Ready |
| 4 | BAUD DIVISOR LATCH | RW | $D_{15-0}$ | 16-bit word for baud rate selection. |
| 6 | MASTER CONTROL REGISTER (MCR) | W | $D_{15-11}$ | Reserved |
| | | | $D_{10}$ | Force pwm on transmitter idle. Set this bit high to force a 50% duty cycle PWM on transmitter idle. Set this bit low to passivate the PWM on transmitter idle. |
| | | | $D_{9-8}$ | 11 Reserved.<br>10 NRZ. Input and output are not encoded (not return to zero).<br>1 Tone. Input and output are encoded as dual frequency tone.<br>0 PWM. Output is modulated-width pulses. Input is dual frequency. |
| | | | $D_{7-6}$ | Reserved |
| | | | $D_5$ | Transmit Enable. Set this bit high to enable transmitter. |
| | | | $D_4$ | FIFO Enable. |
| | | | $D_3$ ♣ | Reset Transmitter - includes FIFO. |
| | | | $D_2$ ♣ | Reset Receiver - includes FIFO. |
| | | | $D_1$ ♣ | Transmitter FIFO Reset. |
| | | | $D_0$ ♣ | Receiver FIFO Reset. |

1. ♣This symbol indicates that the bit is "push-button". Writing the bit high initiates an action, and the bit is self-clearing.

Channel Select Register (Address 0)

This is an 8-bit register, that points to the currently selected channel. It acts as an index for all read or write access to any other registers in the DTASC. This register is typically written first for channel selection.

Receiver and Transmitter Buffer Register (Address 1)

The RECEIVER BUFFER REGISTER is a readonly byte register located at address 1. The TRANSMITTER BUFFER REGISTER is a writeonly byte register located also at address 1. Data bytes written into the TRANSMITTER BUFFER REGISTER are stored in a 8-level deep transmit FIFO of the selected channel, ready for transmission. However, transmission itself does not start until the Trans mit Enable Bit in the MASTER CONTROL REGISTER is set high. Data received by the receiver is stored in a 16-level deep receive FIFO. The data is read out the FIFO through this RECEIVER BUFFER REGISTER.

Line Control Register (Address 2)

This write-only 16-bit register determines the data frame format, in number of bits and parity. It also contains the bit used to send out a break character.

Loopback (D12)

Set this bit high to enable local loopback mode in the selected channel. In loopback mode, the transmitter dual tone FSK output is fed back to the receiver dual tone FSK input, and the TXON output is forced low.

Hysteresis (D11)

This bit affects the dual tone FSK receiver of the selected channel only. This bit should be normally high, so the continuous autocorrelator circuit output is evaluated with maximum hysteresis, which is the preferred configuration (see Section IV.7.6.1). If this bit is set low, hysteresis is considerably reduced. This bit is overridden by the Integrate Dump bit (D7).

FoxComm/HART Protocol Selection (D9-D8)

These two bits determine the type of dual tone signal in the selected channel, whether FoxCommI, FoxCommII or HART. In addition to setting these bits properly, the appropriate baud rate has to be programmed into the BAUD DIVISOR LATCH.

Integrate Dump (D7)

This bit affects the dual tone FSK receiver of the selected channel only. This bit should be normally low, so the demodulator output is driven by the internal continuous autocorrelator circuit, which is the preferred configuration. If set high, the demodulator output is instead driven by the internal integrate and dump circuit, which is normally used only for carrier detection. This bit overrides the Hysteresis bit (D11).

Set Break (D6)

Set this bit high to force a low (mark) at the TXQ NRZ transmitter serial output. A continuous mark on the line with a duration equivalent to one full frame is considered a break character. The usage of this bit to send out a break character is as follows: Write an arbitrary byte to the TRANSMITTER BUFFER REGISTER. Follow this immediately by setting the Set Break bit high, which forces the line low. Now poll the Transmitter FIFO Empty bit in the LINE STATUS REGISTER, until his bit is cleared low. When this occurs, clear the Set Break bit. This will send a break character with the desired duration.

Stick Parity (D5)

Set this bit high to enable stick parity in both transmitter and receiver. With stick parity enabled, the frame has a parity bit which is forced to be the logic complement of bit D4. The name of bit D4 is Even Parity Select, even though there is no relation with even parity when used for stick parity. This mechanism allows to force the parity bit to any value, regardless of the data. Write this bit low to disable stick parity, which is the desired setting when normal even or odd parity is desired.

Even Parity Select (D4)

Write this bit high for even parity in both transmitter and receiver. In even parity, the number of high bits in the frame is even, including the parity bit. Write this bit low for odd parity in both transmitter and receiver. In odd parity, the number of high bits in the frame is odd, including the parity bit. This even/odd parity scheme applies when the Stick Parity bit D5 is low. However, if the Stick Parity bit D5 is high, D4 is no longer an even parity bit. Instead, the parity bit in the frame is forced to be the logic complement of this bit D4.

Parity Enable (D3)

Write this bit high to enable parity in both transmitter and receiver. Parity may be odd/even parity, or stick parity. If this bit is low, parity is disabled, and the transmitter does not send a parity bit as part of the frame, and the receiver does not expect a parity bit as part of the frame.

Stop Bits (D2)

Writing this bit high forces the transmitter to send two contiguous stop bits. Writing this bit low causes the transmitter to send only one stop bit to end the frame.

Word Length (D1-D0)

This field determines the number of data bits in both the transmitter and the receiver, according to the table below:

| Number of Bits $D_1$-$D_0$ | NUMBER OF BITS |
|---|---|
| 11 | 8 |
| 10 | 7 |
| 01 | 6 |
| 00 | 5 |

Line Status Register (Address 2)

This read-only register returns the status of the transmit and receive FIFO, as well as the indication of any possible receiver errors. A readout of this register indicates the receiver status pertinent to the data while it is still stored in the last position of the receiver FIFO (or receiver buffer). The last FIFO position is the one that stores the character to be read out next on the RECEIVER BUFFER register. Therefore, for valid receiver status information, this LINE STATUS REGISTER must be read before reading the RECEIVER BUFFER register Reading this register clears the error conditions reported in bits (D4-D1).

Frame In Progress (D10)

This bit is set high when the NRZ serial receiver detects a start bit and stays high for the duration of the valid frame. The bit is cleared when the stop bit is expected. This bit is valid in both NRZ and dual tone modes.

Tone Detect (D9)

This bit is set high when the demodulator in the receiver detects a legal tone. It is zero otherwise. To be legal, the tone must be in the vicinity of either one of the valid frequencies that represent one and zero, as determined by the integrate-and-dump circuit at the receiver. This bit is meaningless when the DTASC is used in NRZ signal encoding mode.

Transmitter FIFO Full (D8)

This bit is high if the transmit FIFO is full, and is low otherwise.

Error in Receiver FIFO (D7)

This bit is high if one or more byte characters still stored in the receive FIFO have been received either as a break frame, or with a framing error, or with a parity error. The bit is low if no FIFO position contains data received under any of these conditions.

Transmitter Empty (D6)

This bit is high if the transmit FIFO is empty and the transmitter is currently idle and not transmitting any frame. The bit is low otherwise. Alternatively, when the FIFOs are disabled, this bit is high if the transmit holding buffer is empty and the transmitter is currently idle.

Transmitter FIFO Empty (D5)

This bit is high if the transmit FIFO is empty, and is low otherwise. Alternatively, when the FIFOs are disabled, this bit is high if the transmit holding buffer is empty. Note that this bit may be high, while the Transmitter Empty bit (D6) is low. This occurs when the transmitter is still in the process of sending out a frame, which was the last character read out of the FIFO (or transmit holding buffer if FIFO is disabled).

Break Interrupt (D4)

This bit is high if the data stored in the last position of the FIFO (or receiver buffer if FIFOs disabled) was received as a break character. A break character occurs if the receiver data input remains low during the equivalent duration of a frame.

Framing Error (D3)

This bit is high if the data stored in the last position of the FIFO (or receiver buffer if FIFOs disabled) was received with a framing error. A framing error occurs when the frame is not terminated by at least one stop bit. This bit is low when no framing error has been detected.

It is a low (space) in the receiver frame that causes a framing error (when a high was expected). The receiver resynchronizes itself, treating this low in the frame as a start bit of a new frame.

Parity Error (D2)

This bit is high if the data stored in the last position of the FIFO (or receiver buffer if FIFOs disabled) was received with a parity error. This bit is low when no parity error has been detected.

Overrun Error (D1)

This bit is high if an attempt was made to overwrite the data that is now stored in the last position of the FIFO (or receiver buffer). This attempt occurs when a frame's reception is completed at a time that the receive FIFO (or data buffer if FIFOs disabled) is full. The data already stored is not overwritten, but the data that has been just received gets lost. This bit is low when no attempt to overwrite data occurred during the last frame reception.

Data Ready (D0)

This bit is high when the receive FIFO (or data buffer if FIFOs disabled) is not empty. This indicates that at least one received character may be read out. This bit is low when the FIFO (or data buffer) is empty, and there is no data to read.

Baud Divisor Latch (Address 4)

This register determines the baud rate according to the following rule. The raw transmitter and receiver clock frequency is the ratio of the C_CLK clock input frequency divided by four and divided by the numeric equivalent of the binary number stored in the DIVISOR LATCH REGISTER. The data (baud) rate of both transmitter and receiver is 1/16th of the raw clock frequency. Clearing this register causes the transmitter and receiver clock frequency to be equal to the C_CLK pin divided by four. The proper programming values for the three supported protocols are displayed in the table below, assuming a nominal C_CLK frequency of 16 MHz.

| PROTOCOL | BAUD RATE | FORMULA | BAUD DIVISOR LATCH PROGRAMMING VALUE (HEX) |
|---|---|---|---|
| IT1 | 600 | 16 MHz/ (600 × 16 × 4) = 417 | 1A1 |
| IT2 | 4800 | 16 MHz/ (4800 × 16 × 4) = 52 | 34 |
| HART | 1200 | 16 MHz/ (1200 × 16 × 4) = 208 | D0 |

PROGRAMMED BAUD RATES FOR IT1, IT2 AND HART (C_CLK 16 MHZ)

This register controls various parameters.

Force PWM on Transmitter Idle (D10)

This bit is valid only when the signal encoding is PWM. Set this bit high to force a 50% duty cycle on the PWM serial output when the transmitter is idle. Set this bit low to passivate the transmitter serial output when the transmitter is idle. When this bit is set high, the resulting 50% duty cycle signal may be used by external circuits as a carrier to modulate the received dual tone, and pass the high frequency modulated signal through a galvanic isolation transformer.

Signal Encoding (D9-D8)

These two bits determine the signal encoding expected at the receiver serial input, and also the signal encoding provided at the transmitter serial output. The NRZ encoding bypasses the modem and PWM circuits, and the expected input is non-return to zero (NZR) frames flanked with start and stop bits. Selecting this mode is equivalent to using the DTASC as a simple UART. The Tone encoding bypasses the PWM circuit, and the data at the serial input and serial output is dual tone. The PWM encoding forces high frequency pulse-width-modulated data to be transmitted at the serial output, and expects to receive dual tone data at the serial input.

Transmit Enable (D5)

Setting this bit high forces the data stored in the transmit FIFO (or holding register when FIFOs are not enabled) to be transmitted out. Keeping this bit low allows data to be written to the transmit FIFO without starting transmission. This feature is not usually found in standard UARTs, which instead respond to FIFO writes by automatically initiating transmission. Use of this bit facilitates maximum FIFO utilization, so that the FIFO may first be filled, and the transmission may then be commenced by setting this bit high with a full FIFO. Clearing this bit somewhere in the middle of a frame during a transmission does not stop the transmission. Rather, the current frame transmission is carried out to completion, and only then the transmitter stops.

FIFO Enable (D4)

Write this bit high to enable the transmit and receive FIFOs. Write this bit low to disable the FIFOs. The transmit FIFO is eight bytes deep, the receive FIFO is sixteen bytes deep. When the FIFOS are disabled, the transmitter operates with a transmit holding buffer, and the receiver operates with a receiver buffer. FIFOs increase the data throughput, and ease the processor's service of the DTASC.

Reset Transmitter (D3)

Write this bit to reset the transmitter. The bit is "push-button". Writing the bit high initiates the reset, and the bit is self-clearing.

Reset Receiver (D2)

Write this bit to reset the receiver. The bit is "push-button". Writing the bit high initiates the reset, and the bit is self-clearing.

Transmitter FIFO Reset (D1)

Write this bit high to reset the transmit FIFO. The bit is "push-button". Writing the bit high initiates the FIFO reset, and the bit is self-clearing.

Receiver FIFO Reset (D0)

Write this bit high to reset the receive FIFO. The bit is "push-button". Writing the bit high initiates the FIFO reset, and the bit is self-clearing.

Structural and Functional Description

As shown in FIG. 5, the DTASC is made of eight communication channels, each consisting of a transmitter and a receiver. The DTASC transmitter is made of a Universal Serial Transmitter, an FSK Modulator and a PWM circuit. The Universal Serial Transmitter converts parallel bytes into NRZ equivalent serial frames (LSB is transmitted first), with start, data, optional parity and stop bits. The Modulator converts the resulting NRZ serial bit frame into equivalent dual tone FSK. The PWM circuit has the width of its high frequency pulse modulated by the dual tone FSK. The actual transmitted signal may be chosen among any one of the Universal Serial Transmitter, the Modulator or the PWM circuit modules.

Figure 9:
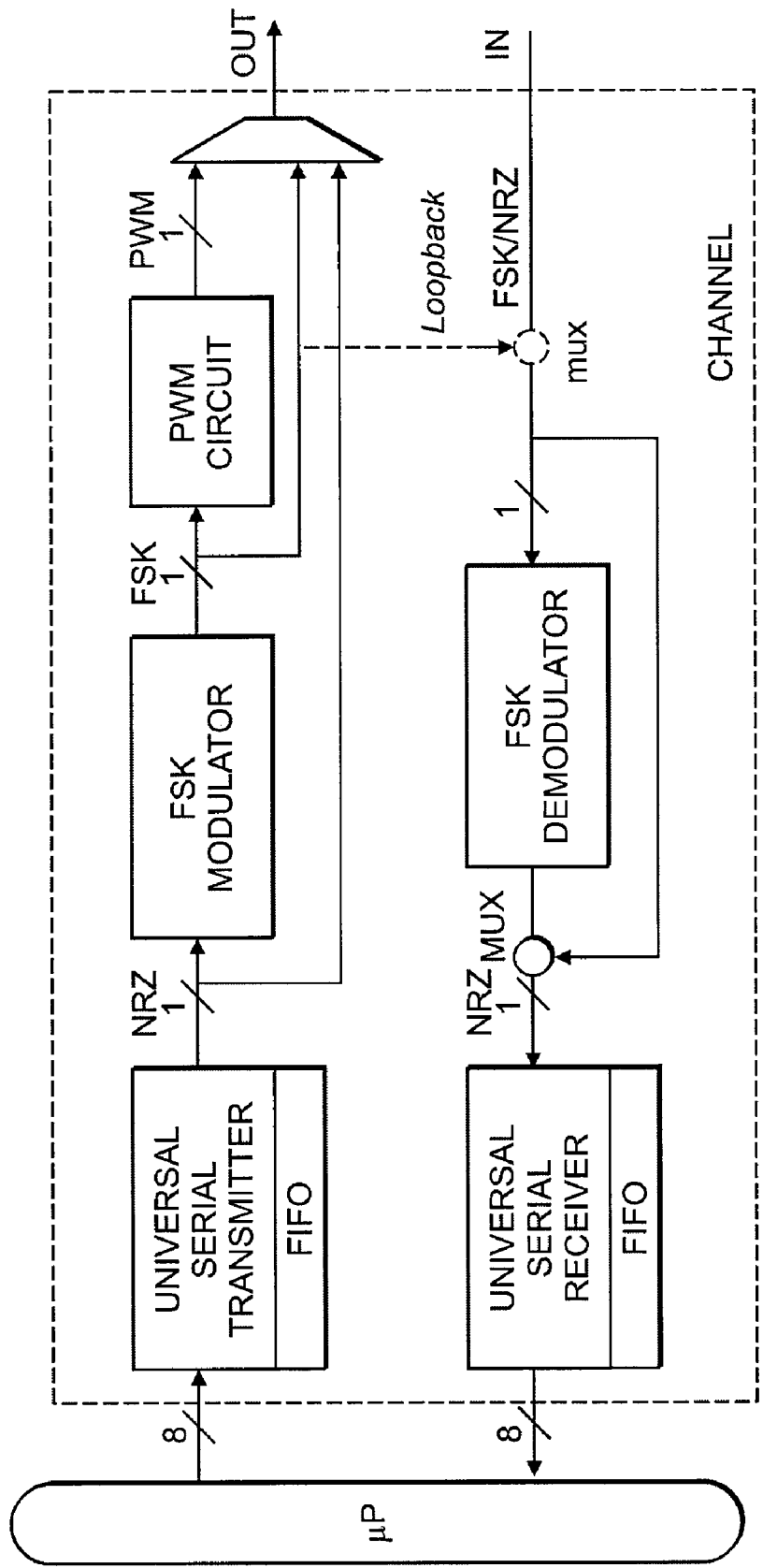
FIG. 9 depicts a channel block diagram for the dual tone asynchronous block of FIG. 5.

The DTASC receiver is made of an FSK Demodulator and a Universal Serial Receiver. The Demodulator takes in FSK dual tone signal and recovers the equivalent NRZ serial data bits (including start, parity and stop bits). The Universal Serial Receiver strips the start, parity and stop bits, and converts the NZR serial frame into parallel bytes of data. The incoming signal may be either FSK or NRZ, and it may be routed to the appropriate module. See FIG. 9.

Local loopback is routed from the FSK Modulator output to the FSK Demodulator input. The local loopback may be used to test the integrity of all the block's internal modules, except for the PWM circuit.

The Universal Serial Transmitter and Universal Serial Receiver may be operated in full duplex mode. The FSM Modulator and Demodulator can be only used in half duplex mode.

Universal Serial Transmitter and Receiver (UART)

Figure 10:
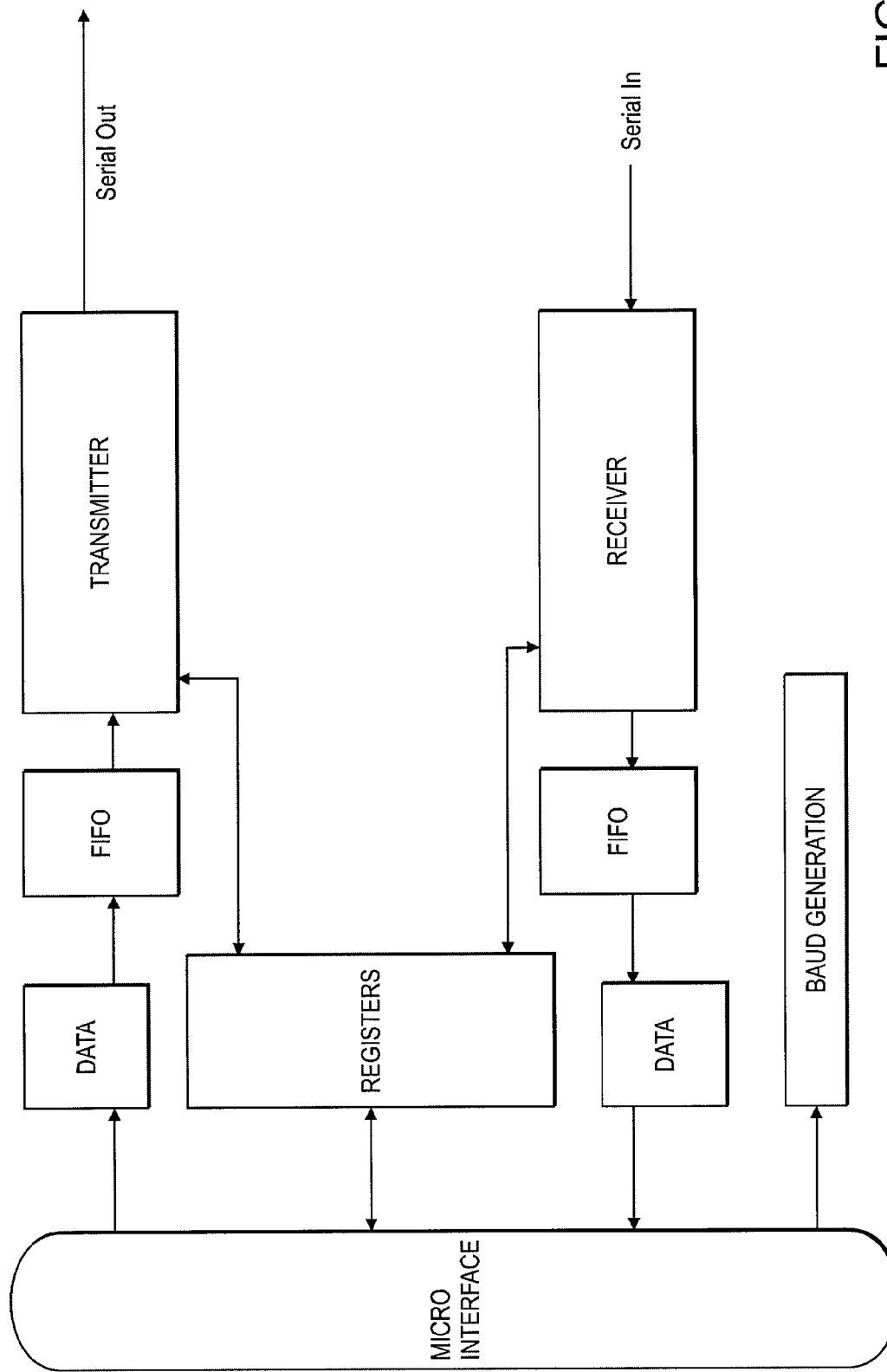
FIG. 10 shows universal serial transmitter and receiver block level diagrams for the dual tone asynchronous block of FIG. 5.

As shown in FIG. 10, the UART consists of a transmitter and receiver (with their FIFOs), a baud generator, and a microprocessor interface. The transmit and receive FIFOs are both 8-bit wide. The transmitter FIFO is 8 levels deep, and the receiver FIFO is 16 levels deep.

Transmitter

Description

The transmitter is organized around a 13-bit parallel to serial shift register. The start and stop bits are loaded in parallel, besides the data bits (up to eight) and parity bit. Data is loaded from the transmit holding register, or from the FIFO if enabled. The bits are shifted out serially at a rate dictated by the number programmed into the divisor latch. The data LSB is shifted out right after the start bit. The shifting occurs under the control of a logic state machine that sequences through idle, load, shift, and stopbit states.

Using the Transmitter

The transmitter controls are in the LINE CONTROL REGISTER. This is where the makeup of the frame is determined, namely, the number of data and stop bits, whether there is parity and the type of parity. To start transmitting, data must be written first into the TRANSMIT BUFFER REGISTER. The Transmit Enable bit in the MASTER CONTROL REGISTER must then be set high. The data written in the FIFO is then transferred to the transmitter holding register, or to the FIFO if enabled. Any data stored in the holding register (or the FIFO) is scheduled for transmission, and is transmitted out as soon as the transmitter becomes idle. The transmitter first sends out the start bit, immediately followed by the LSB. Once it starts sending data, the transmitter will continue transmitting frames as long as it finds data in the transmit FIFO, and as long as the Transmit Enable bit is high.

The transmitter may be serviced by polling. When polling, read the Transmitter FIFO Empty Bit in the LINE STATUS REGISTER. Enabling the FIFOs relieves the burden of servicing the UART, since up to sixteen characters may be stored in the FIFO by writing them all sequentially and without interruption into the TRANSMITTER BUFFER REGISTER.

Receiver

Description

The receiver is organized around a serial to parallel converter. After detecting a start bit, the frame bits are shifted serially into the converter, including up to the first stop bit. The stored frame is examined for possible parity errors, framing errors, and also for the possibility of being a break character. This error/status condition is stored together with the data into an 11-bit (three bits for error, plus eight data bits) receiver holding register, or into the 16-deep receiver FIFO if enabled. The errors affect the readout of the LINE STATUS REGISTER when the data gets to the read end of the FIFO.

Detection of the start bit is done with the help of a simple transition filter, in order to ignore any possible spurious low noise pulses in the receive line. Data is first clocked by the raw receiver clock into an eight-register transition filter. The transition filter declares a start bit only if four consecutive samples are low after four consecutive high samples. Once a start bit is detected, the rest of the frame is sampled at the estimated half point of each bit, based on the given baud rate. The raw receiver clock (obtained from the master clock input CLK after division by the divisor latch) is 16 times faster than the data (baud) rate.

FSK Modulator

Figure 11:
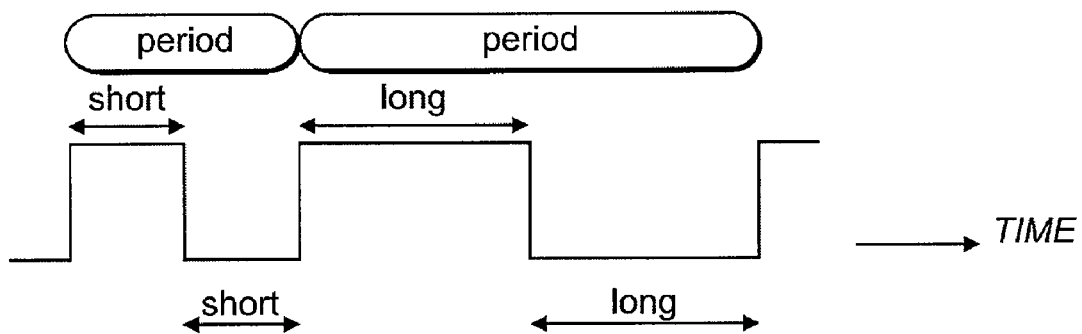
FIG. 11 illustrates the duration of signal peaks and valleys in a dual tone signal of the type generated by an FSK modulator of the dual tone asynchronous block of FIG. 5.

The FSK modulator accepts as input a simple non-return to zero data bit stream and encodes it as a dual tone signal. The resulting dual tone is characterized by only two possible discrete periods, depending on the data to be encoded. The duration of the signal "peaks" and "valleys" is itself quantized to two possible discrete time constants, as illustrated in FIG. 11.

Figure 12:
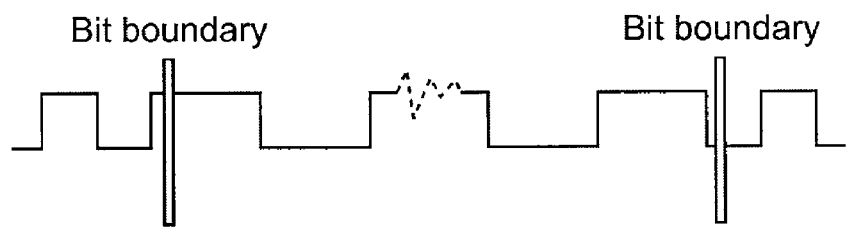
FIG. 12 depicts re-evaluation of a dual tone signal in a dual tone asynchronous block of FIG. 5.
Figure 12:
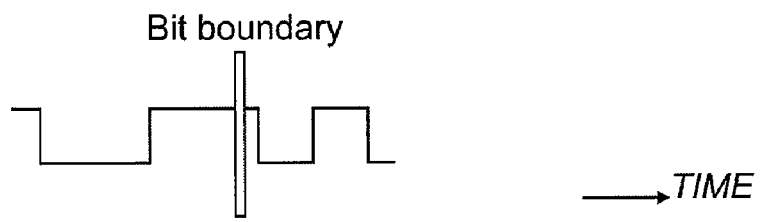

On a first instance, the dual tone generation algorithm samples the bit to be encoded at the onset of a signal swing, and thereby determines the duration of the starting "peak" or "valley". This would be sufficient if dual tone signal swings were aligned with bit boundaries. However, bit boundaries are not normally coincident with dual tone signal periods. Therefore, the original estimation of "peak" or "valley" signal duration must be re-evaluated again at the bit boundary. This may or may not result in a duration update, as illustrated in FIG. 12.

Figure 13:
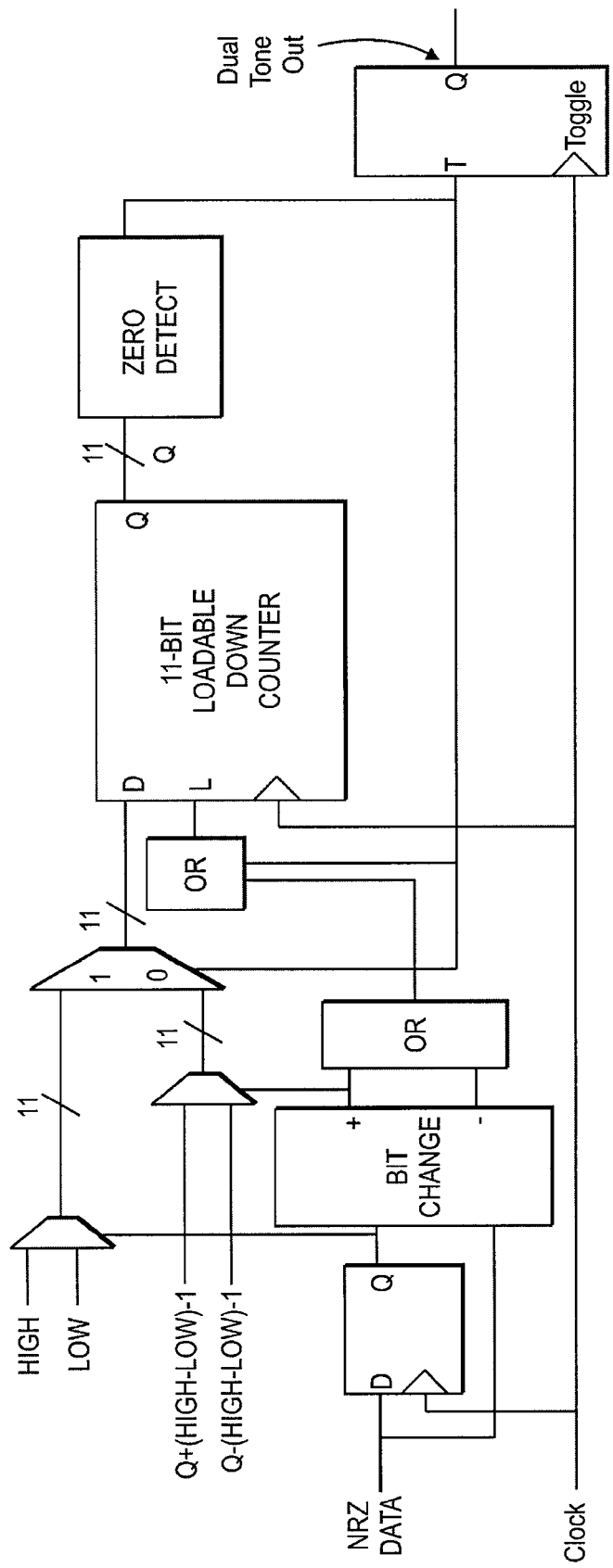
FIG. 13 depicts a dual tone generation circuit in a dual tone asynchronous block of FIG. 5.

The complete dual tone generation algorithm implementation is illustrated in FIG. 13. The circuit is centered around an 11-bit loadable down counter. Whenever the counter counts down to zero, the dual tone signal swings. The counter is preloaded with either a HIGH or LOW constant, depending on the encoding bit.

The choice of constant determines the short and long duration of the dual tone "peaks" and "valleys". On a bit boundary, if a bit change occurs, the current value Q of the counter is conditionally adjusted by an amount equal to the difference of HIGH and LOW, resulting in a potential duration update. The modulator circuit clock frequency is different for each protocol, as depicted in the table below. The table also lists the values of the HIGH and LOW constants for each protocol, as well as the resulting mark and space tone frequencies.

| | FSK MODULATOR CIRCUIT PARAMETERS | | | | | |
|---|---|---|---|---|---|---|
| PROTOCOL | CLOCK FREQUENCY (MHz) | HIGH | LOW | MARK TONE FREQUENCY (Hz) | SPACE TONE FREQUENCY (Hz) | MAX TONE FREQUENCY ERROR (%) |
| IT1 | 0.5 | 79 | 47 | 5,208.33 | 3,125.00 | 0.010 |
| IT2 | 1.0 | 79 | 47 | 10,416.67 | 6,250.00 | 0.003 |
| HART | 4.0 | 908 | 1666 | 1,199.76 | 2,200.22 | 0.020 |

FSK Demodulator

The FSK demodulator accepts as input a digital dual tone signal and recovers the equivalent NRZ data bit stream. The user has a choice of two different algorithms to decode the dual tone, one is discrete digital continuous autocorrelation and the other one is integrate and dump. Both algorithms are described below.

Discrete Digital Continuous Autocorrelation

Figure 14:
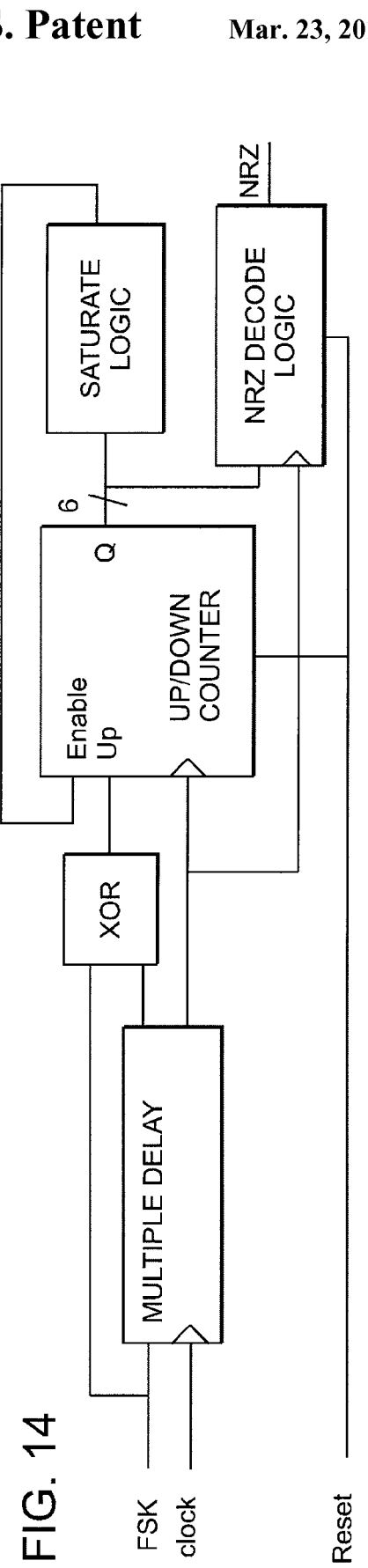
FIG. 14 is a block diagram of the continuous autocorrelation method in a dual tone asynchronous block of FIG. 5.

Discrete digital continuous autocorrelation compares the original dual tone signal with its own time-delayed version, using an XOR logic gate. The XOR gate output is either mostly high or mostly low, depending on the frequency of the input tone, and this signal is accumulated by virtue of controlling the up/down control of a 6-bit digital counter. The counter saturates when the count reaches a lower or an upper bound. The original ones and zeroes encoded in the FSK input may be decoded from the accumulated count, as it reaches its upper or lower saturation limits. A block diagram of the continuous autocorrelation method is provided in FIG. 14. The NRZ decode logic is implemented with a JK flip flop, whose J input is set high if the counter saturates at one end, and whose K input is set high if the counter saturates at the other end. This method provides maximum hysteresis and noise immunity. Alternatively, the J and K inputs may be forced high if the counter reaches a given limit away from its neutral center count, but well before saturation (30 and 34 respectively in this design). This last method provides minimum hysteresis and faster response.

Each protocol has its own parameters of circuit sampling clock frequency, number of bit delays, and saturate bounds, as summarized in the table below.

Figures 17, 18:
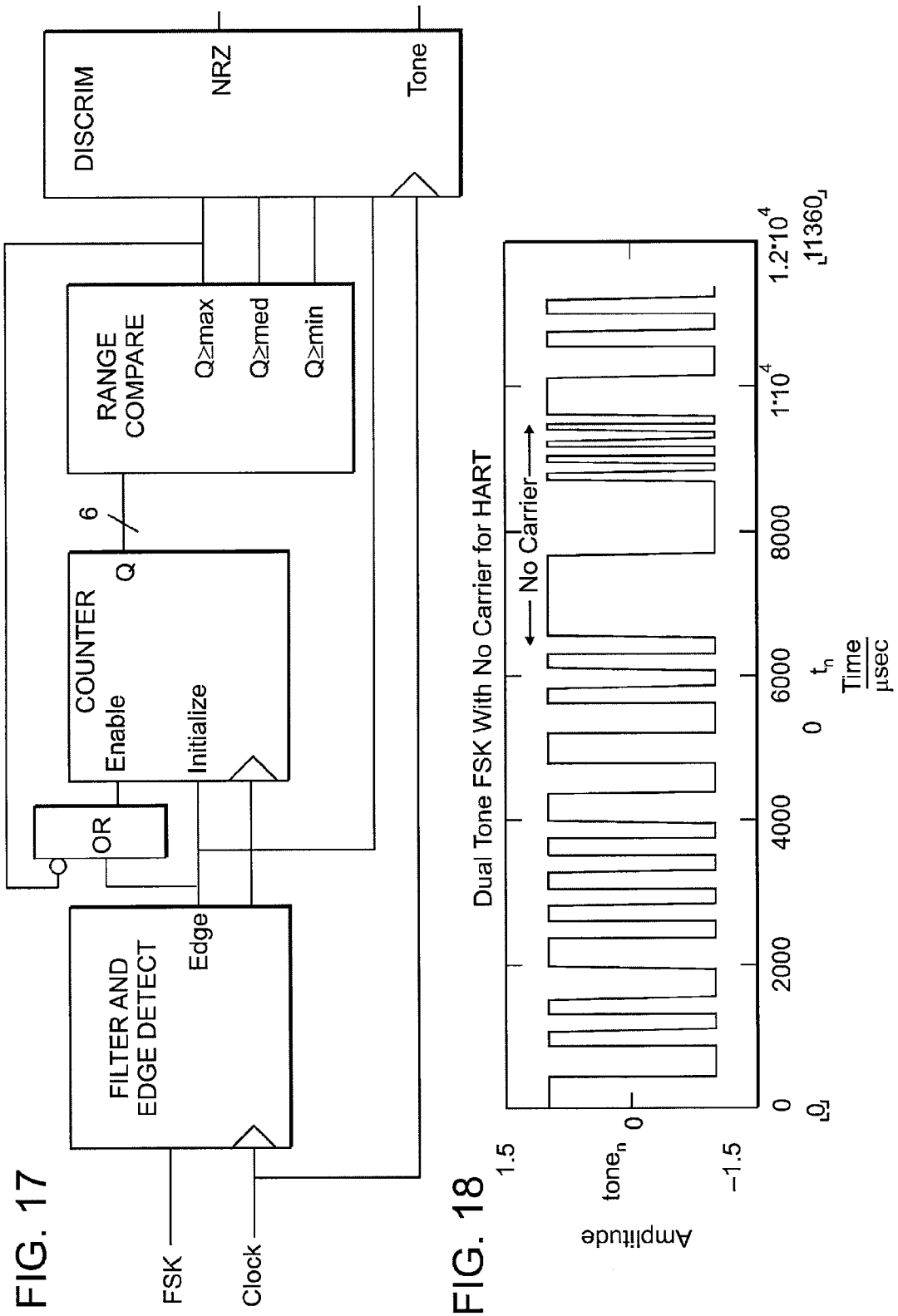
FIG. 17 depicts integrate and dump circuitry of a dual tone asynchronous block of FIG. 5.
FIG. 18 depicts a FSK dual tone signal suffering from low frequency loss and then from high frequency loss of carrier.
Figure 19:
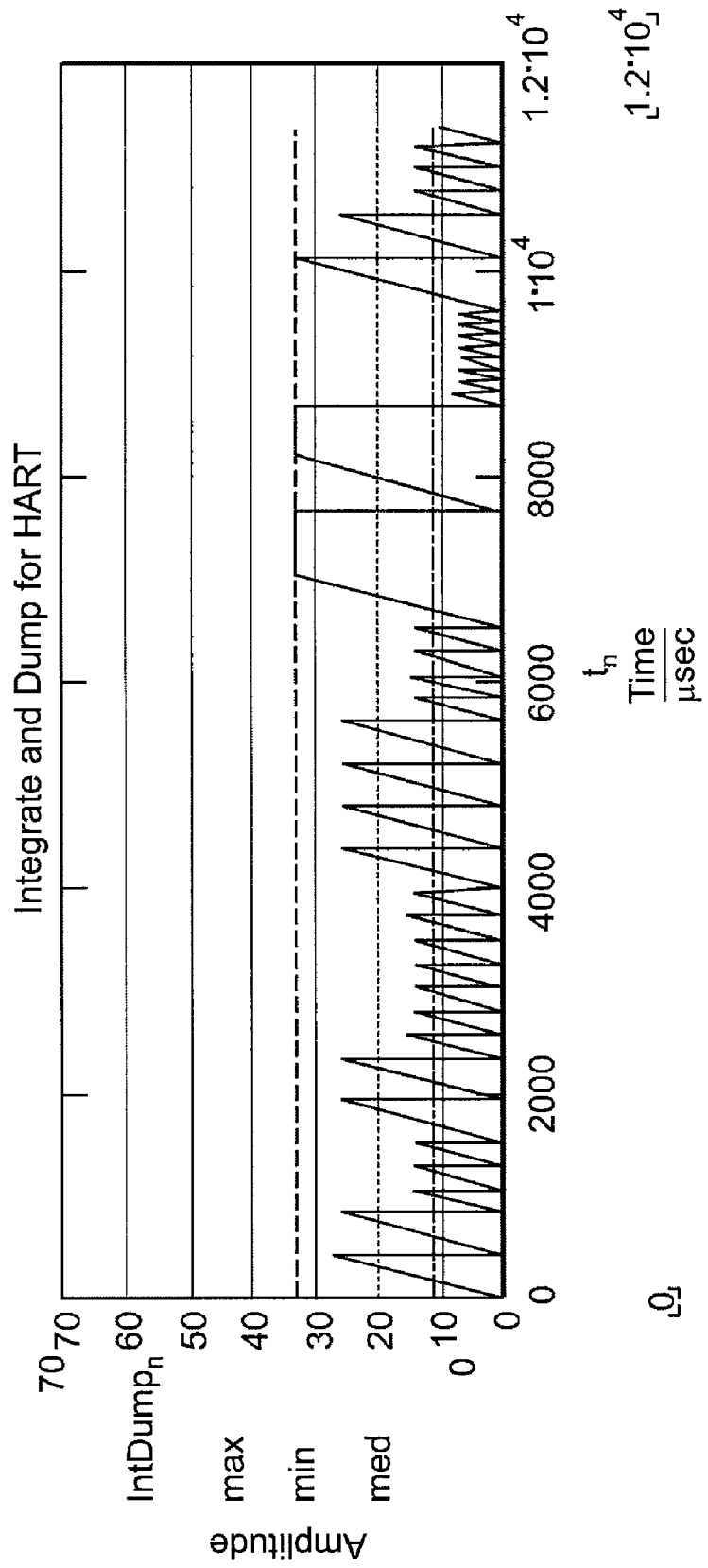
FIG. 19 depicts a count waveform at the integrate and dump circuit of FIG. 19 resulting from the losses depicted in FIG. 18.

FIG. 18 illustrates an example of an FSK dual tone signal suffering first from low frequency and then from high frequency loss of carrier. The resulting count waveform at the integrate and dump circuit is illustrated in FIG. 19.

| CONTINUOUS AUTOCORRELATION PARAMETERS | | | | | |
|---|---|---|---|---|---|
| PROTOCOL | SAMPLING CLOCK FREQUENCY (KHz) | DELAY (bits) | UPPER SATURATION LIMIT | LOWER SATURATION LIMIT | SAMPLES PER FSK PERIOD (high tone/ low tone) | SAMPLES PER BIT |
| IT1 | 125.0 | 22 | 57 | 7 | 24/40 | 208 |
| IT2 | 250.0 | 23 | 41 | 22 | 24/40 | 52 |
| HART | 62.5 | 28 | 44 | 20 | 28/52 | 52 |

Figure 15:
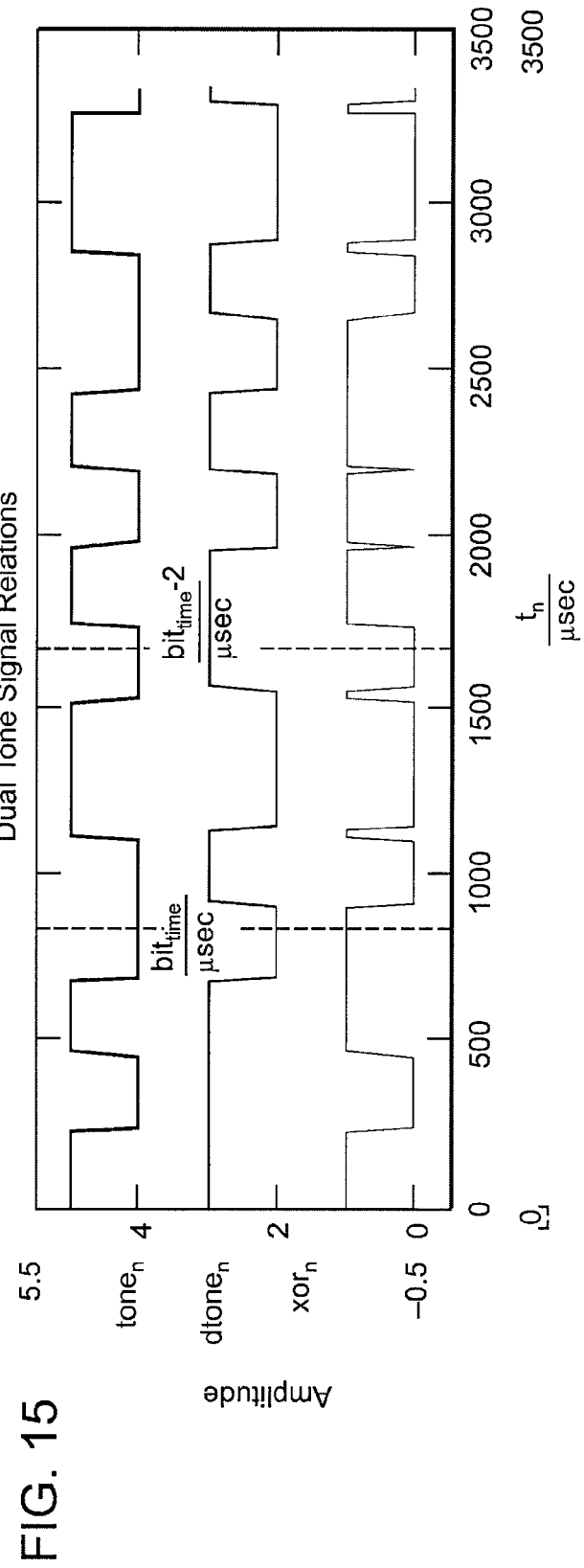
FIG. 15 illustrates the relation between the dual tone input tone, its 28-bit delayed signal tone, their XOR comparison for a HART signal of the type generated by dual tone asynchronous block of FIG. 5.

FIG. 15 illustrates the relation between the dual tone input tone, its 28-bit delayed signal dtone, their XOR comparison xor for HART, plus a bit boundary. The XOR signal is mostly low for a low frequency tone input, which drives the counter down towards an NRZ zero resolution. Conversely, the XOR signal is mostly high for a high frequency tone input, which drives the counter up towards an NRZ one resolution.

Figure 16:
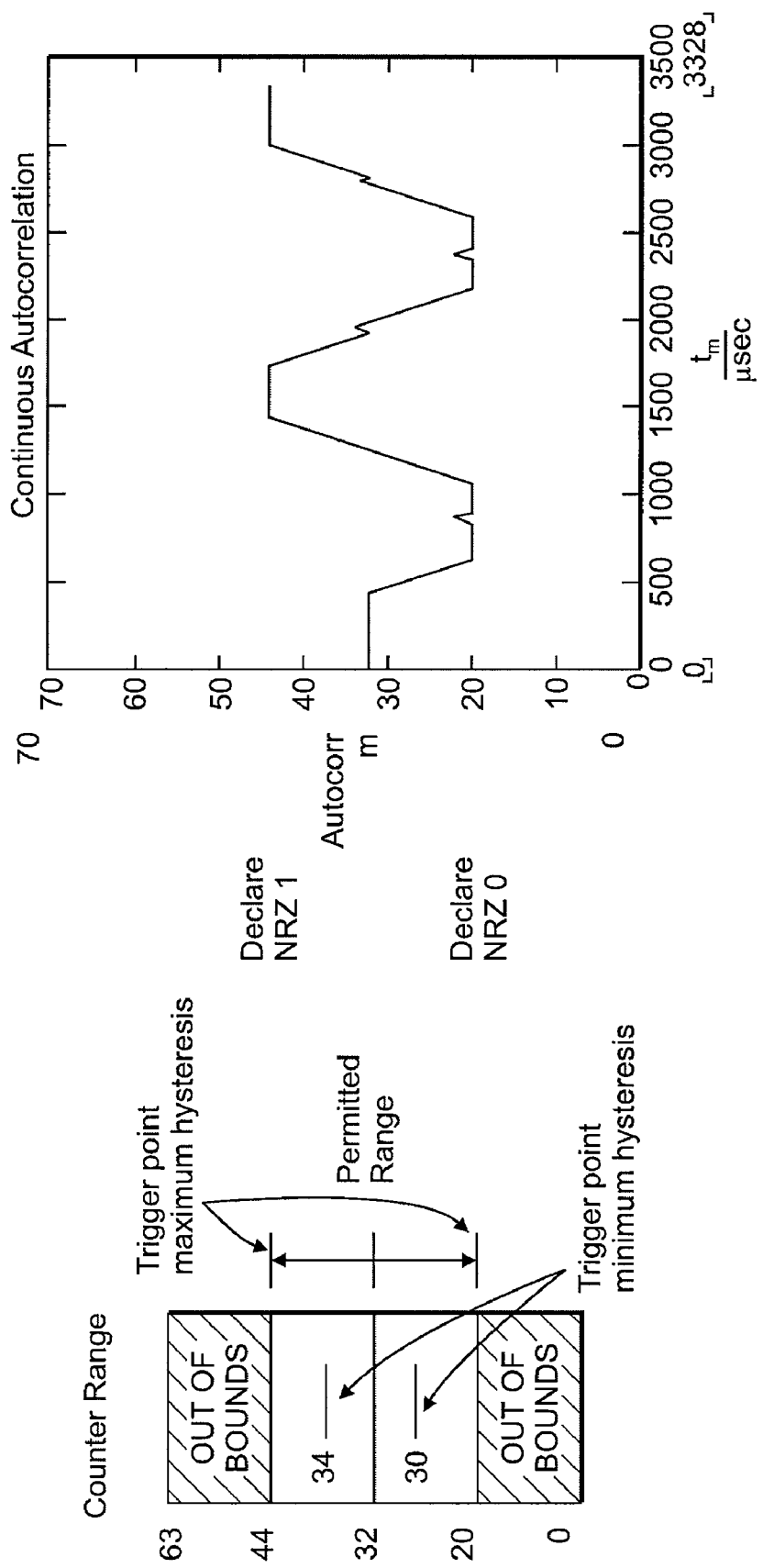
FIG. 16 depicts counter ranges and continuous autocorrelation during generation of a HART signal of the type generated by dual tone asynchronous block of FIG. 5.

FIG. 16 illustrates the counter's permitted and out of bound ranges for HART, as well as the time value of the counter, as it swings towards its saturation high and low. The JK trigger points for minimum hysteresis are shown within the counter valid range.

Integrate and Dump

Referring to FIG. 17, the integrate and dump method accumulates (integrate) a count until a transition is detected in the FSK dual tone input, at which point the counter is initialized to one (dump). If the count is plotted with respect to time, the resulting sawtooth waveform has maximum peaks which are smaller for high frequency tone, and greater for low frequency tone. The essence of the integrate and dump method is to compare these maximum peaks with respect to two discrete legal bands (defined by min, med and max constants). If the peaks are within these bands, the dual tone is legal, and the equivalent NRZ bit is simply decoded from the particular band where the peak lies. The counter saturates when it reaches the upper limit to avoid overruns.

The integrate and dump circuit is very effective for carrier detection. It can easily detect if the tone is outside the frequency bounds of the protocol. The validity of the tone may be read from the LSR register.

The integrate and dump circuit is also used to reset the continuous autocorrelation receiver when no tone is present. Each protocol has its own parameters for circuit sampling clock frequency, as well as bounds for the decoding bands, as summarized in the table below.

| INTEGRATE AND DUMP PARAMETERS | | | | |
|---|---|---|---|---|
| PROTOCOL | SAMPLING CLOCK FREQUENCY (KHz) | MIN | MED | MAX |
| IT1 | 125.0 | 9 | 15 | 26 |
| IT2 | 250.0 | 9 | 15 | 26 |
| HART | 62.5 | 11 | 20 | 33 |

Half Duplex Arbitration

Any dual tone channel may be independently operated in full duplex as a standard serial port (NRZ mode), and it may therefore transmit and receive simultaneously. However, when operated in either tone or PWM mode, the channel is forced to half duplex, and it is only capable of either transmitting or receiving at any given time. In half duplex, the transmit mode is dominant, and the channel will transmit if the transmit FIFO contains any data and the transmit enable bit is set. The receiver is disabled from the time the transmission starts until the time the last piece of data available in the transmit FIFO has been fully transmitted. The hardware enforces full termination of the last transmitted tone, so the line wiggles a whole period, and comes to a full rest before turning off. The receiver becomes enabled whenever the transmitter is idle.

PWM Circuit

The PWM circuit encodes the dual tone FSK into a 1 MHz pulse width modulated signal, and provides trapezoidal transition approximation for the encoded HART mode, but not for IT1 nor IT2.

Figure 20:
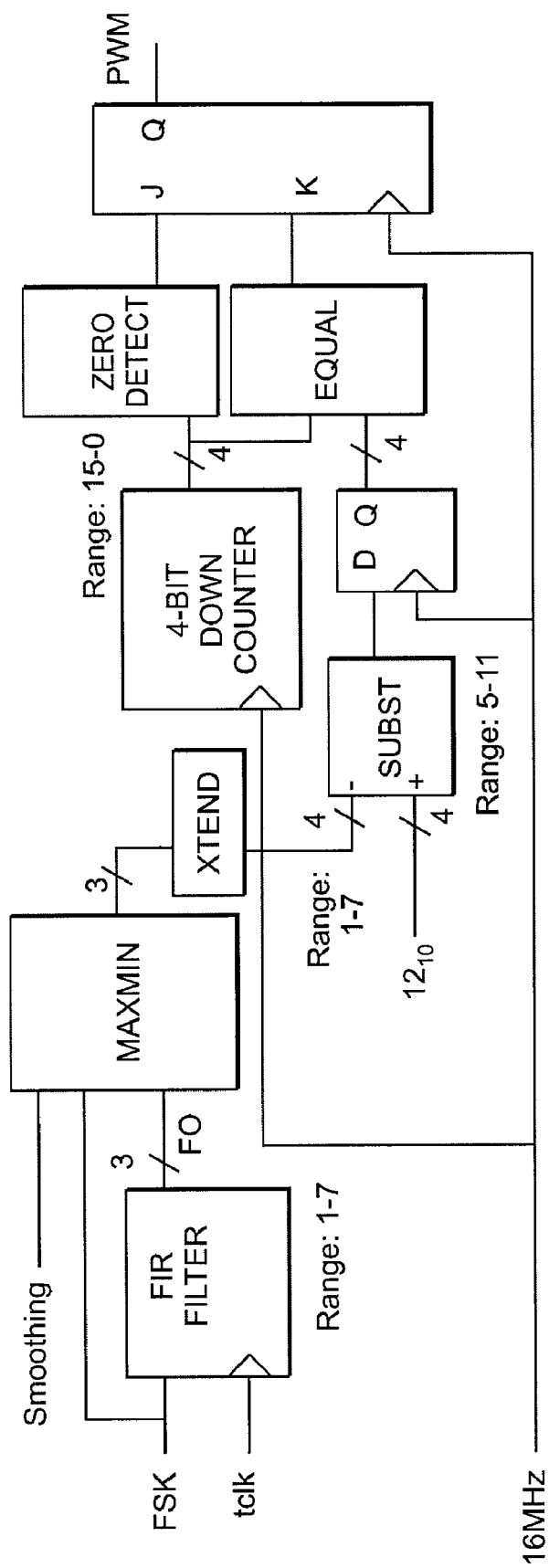
FIG. 20 is a block diagram of the PWM circuit in a dual tone asynchronous block of FIG. 5.
Figure 21:
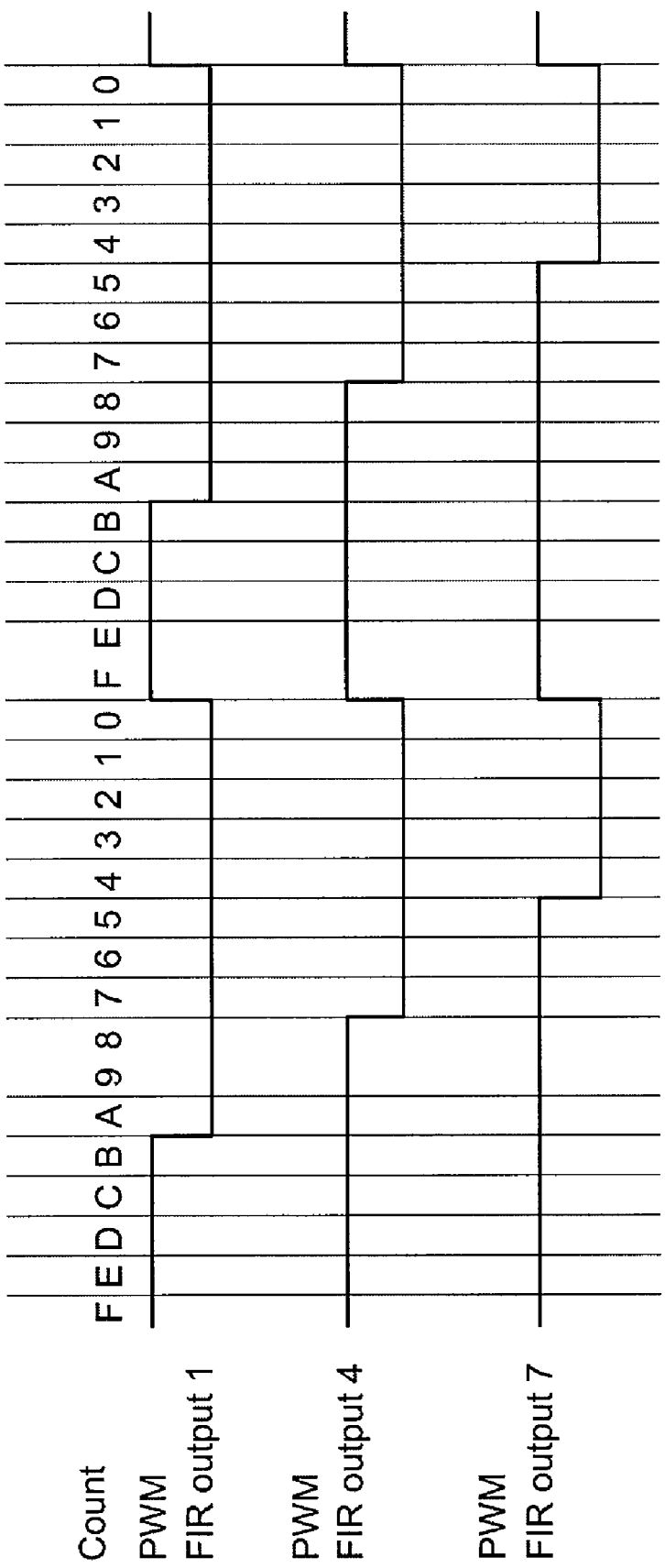
FIG. 21 depicts a PWM waveform generated by a dual tone asynchronous block of FIG. 5.

FIG. 20 is a block diagram of the PWM circuit. The input to the block is a single bit FSK signal, which goes into an FIR filter. The output of the FIR filter is a 3-bit binary-encoded and trapezoidally approximated dual tone signal, whose range is between 1 and 7. This trapezoidal signal goes into a conditional saturation block, which forces the signal to maximum and minimum values to eliminate trapezoidal approximation for IT1 and IT2. The resulting signal is extended to four bits and subtracted from a fixed value of $12_{10}$. The result is compared with a fast 4-bit counter, clearing the PWM output signal when equal, and setting it when zero. The resulting PWM waveform is shown in FIG. 21 for the minimum, median (50%) and maximum pulse widths, corresponding to an FIR output of 1, 4 and 7 respectively.

The FIR filter is a 7-tap FIR filter with unit coefficients, clocked at $1/16$ the transmitter rate. The FSK data is first converted from 1-bit [0,1] to 2-bit two's complement sequence with range [−1,+1]. The filter equation is $$y(n) \sum_{k=0}^{6} x(n-k)$$

Figure 22:
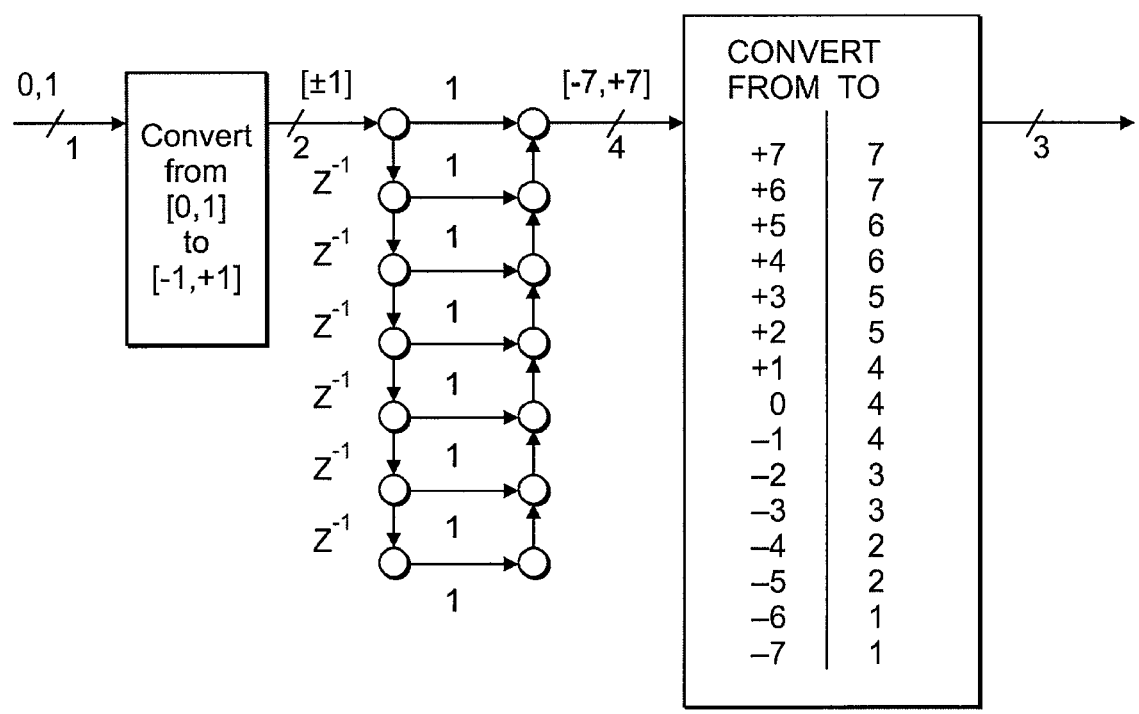
FIG. 22 depicts a FIR filter algorithm in a dual tone asynchronous block of FIG. 5.

The resulting sequence grows to 4-bit, with a range in [−7,+7]. The sequence is finally reduced to three bits in the range [1,7] as illustrated in FIG. 22.

Figure 23:
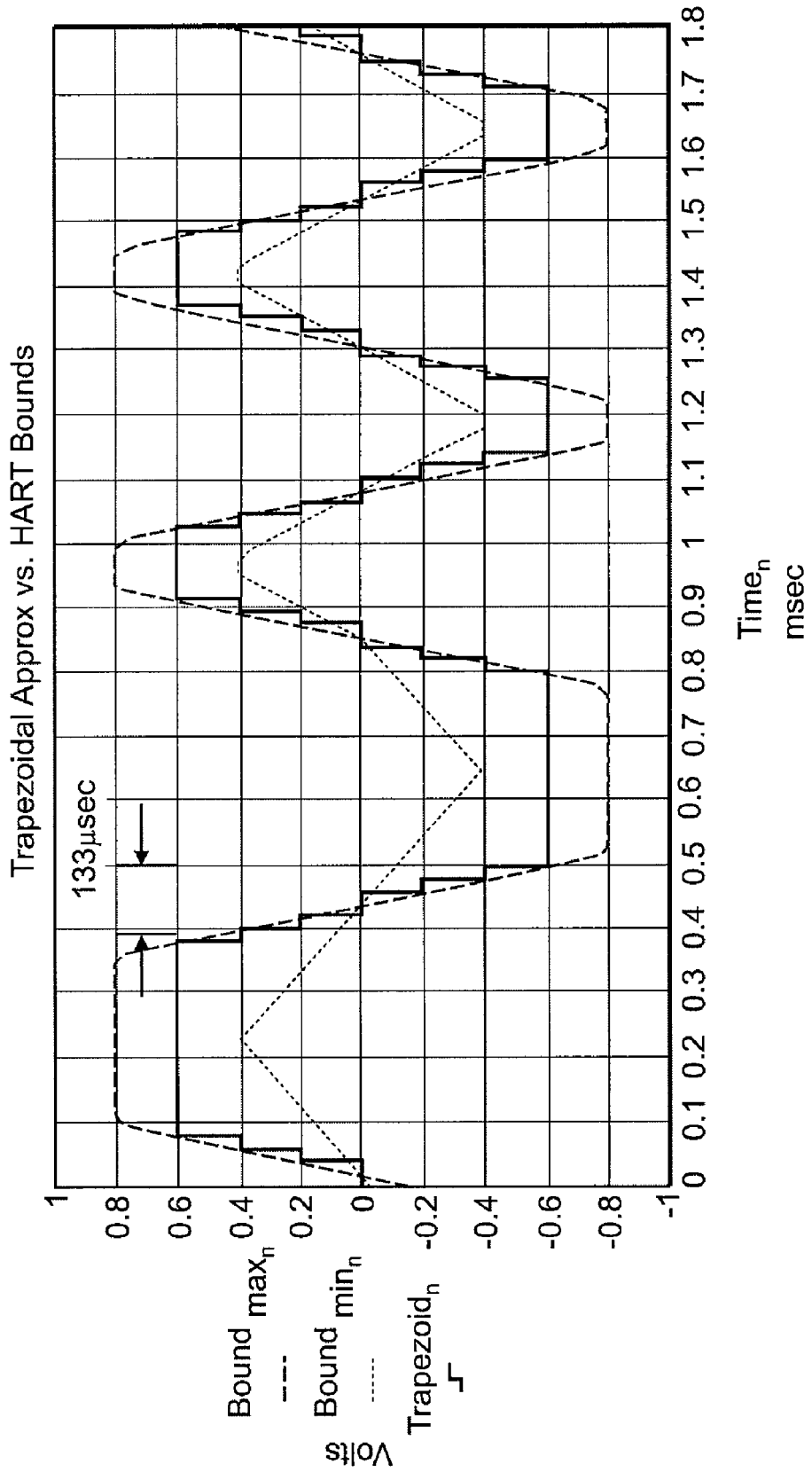
FIG. 23 depicts trapezoidal waveform that emerges from the FIR filter of FIG. 22.

The trapezoidal waveform that emerges from the FIR filter is designed to fit within the minimum and maximum boundary specifications for the HART signal, as illustrated in FIG. 23.

System Loopback

Figure 24:
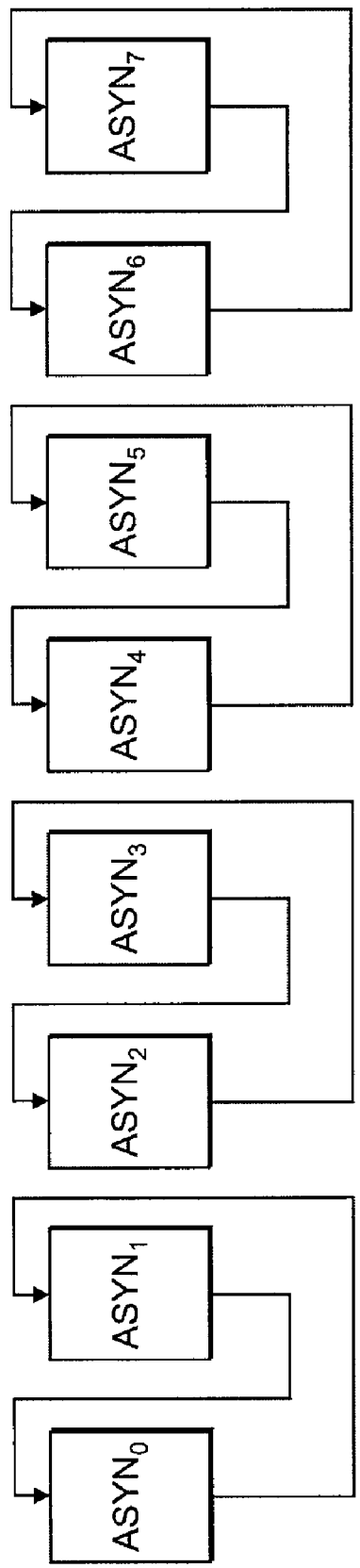
FIG. 24 depicts a loopback configuration in a dual tone asynchronous block of FIG. 5.

Besides the internal loopback provided within each individual channel, the DTASC can be tested in a system loopback mode, in which each channel receives data transmitted by a near neighbor. The receiver input in each channel is thus effectively disconnected from its external pin. The connection topology is illustrated in FIG. 24. This loopback configuration is programmed in the GENERAL TEST REGISTER of the SYSTEM REGISTER block writing the Internal Dual Tone System Loopback bit high.

All eight TXON output signals from the DTASC are deasserted low during system loopback, turning off the external line driver. This allows online system loopback testing.

The Dual Tone Block and the CommControl ASIC

The CommControl ASIC does not have dedicated package pins connecting to the dual tone block. Instead, the general purpose $IO\_SIG_{31-0}$ pins must be appropriately programmed to route inputs and outputs to and from the block. Internal tone input $RXSD_{7-0}$, tone output $TXQ_{7-0}$ and transmit enable $TXON_{7-0}$ signals in all eight dual tone channels may be routed to any external $IO\_SIG_{31-0}$ pins.

More on Continuous Autocorrelation

The discrete digital continuous autocorrelation algorithm described is an equivalent implementation of the following analog mathematical relation $$f(T) = sat\left(\int_{(t=0)}^{T} x(t) \cdot x(t-\tau) dt\right)$$

where x(t) is the dual tone input, τ is an appropriate delay parameter. In the analog case, x(t) is ±1, whereas in the discrete digital case, the FSK consists of ones and zeroes. Multiplication in the domain of ±1 is equivalent to the XOR logic operation in the domain of ones and zeroes.

Pin Multiplex Controller

Introduction

The Pin Multiplexer Controller consists of 32 registers. Each register controls the function of one of the 32 I/O pins of the ASIC. It controls whether the pin is an input or an output and which internal function block is connected to the pin. A bit in the register can be set to invert the signal to or from the I/O pin. A block diagram of one pin controllers is shown in FIG. 25.

Figure 25:
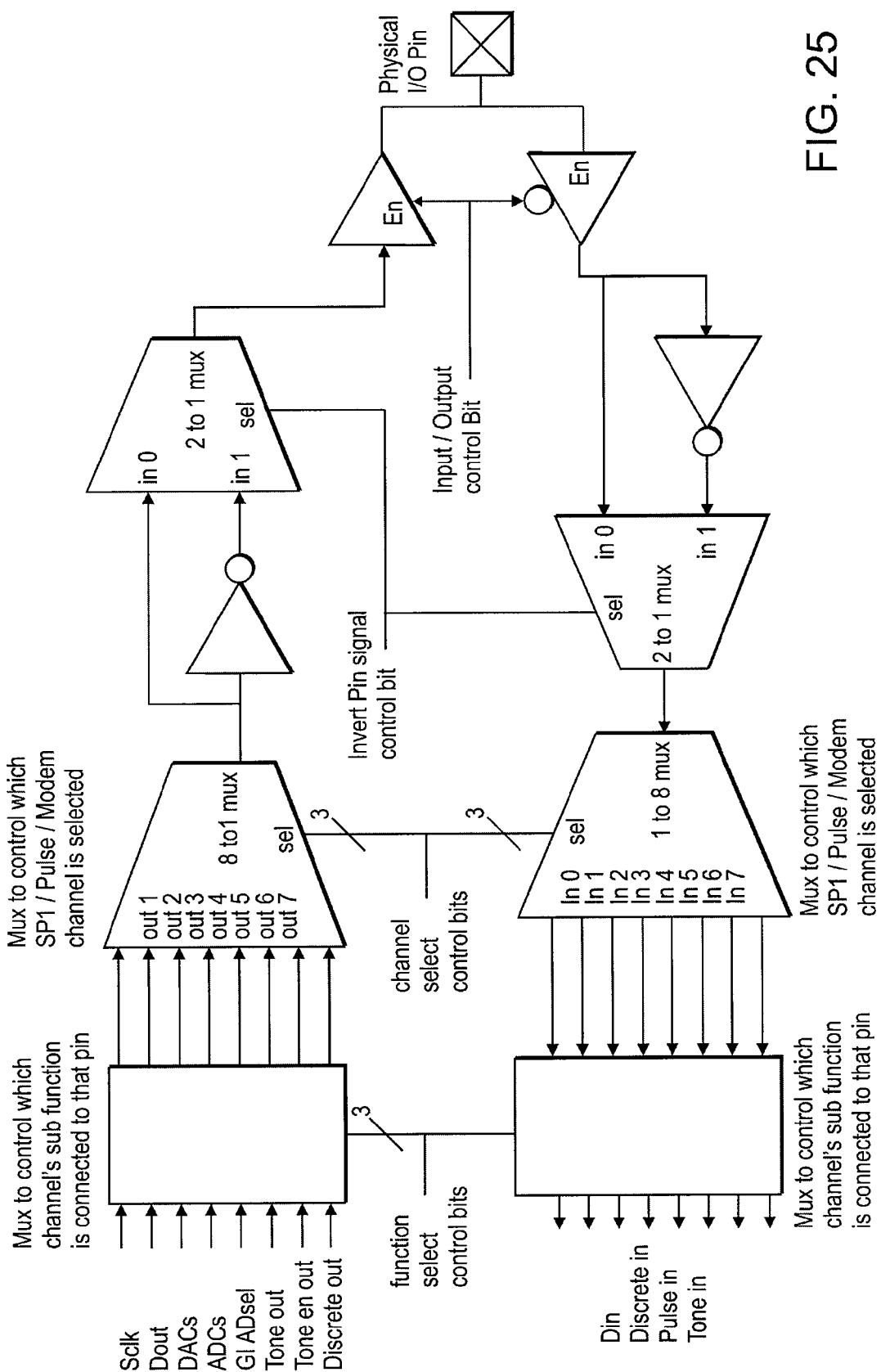
FIG. 25 is a block diagram of a pin controller of a dual tone asynchronous block of FIG. 5.
Figure 26:
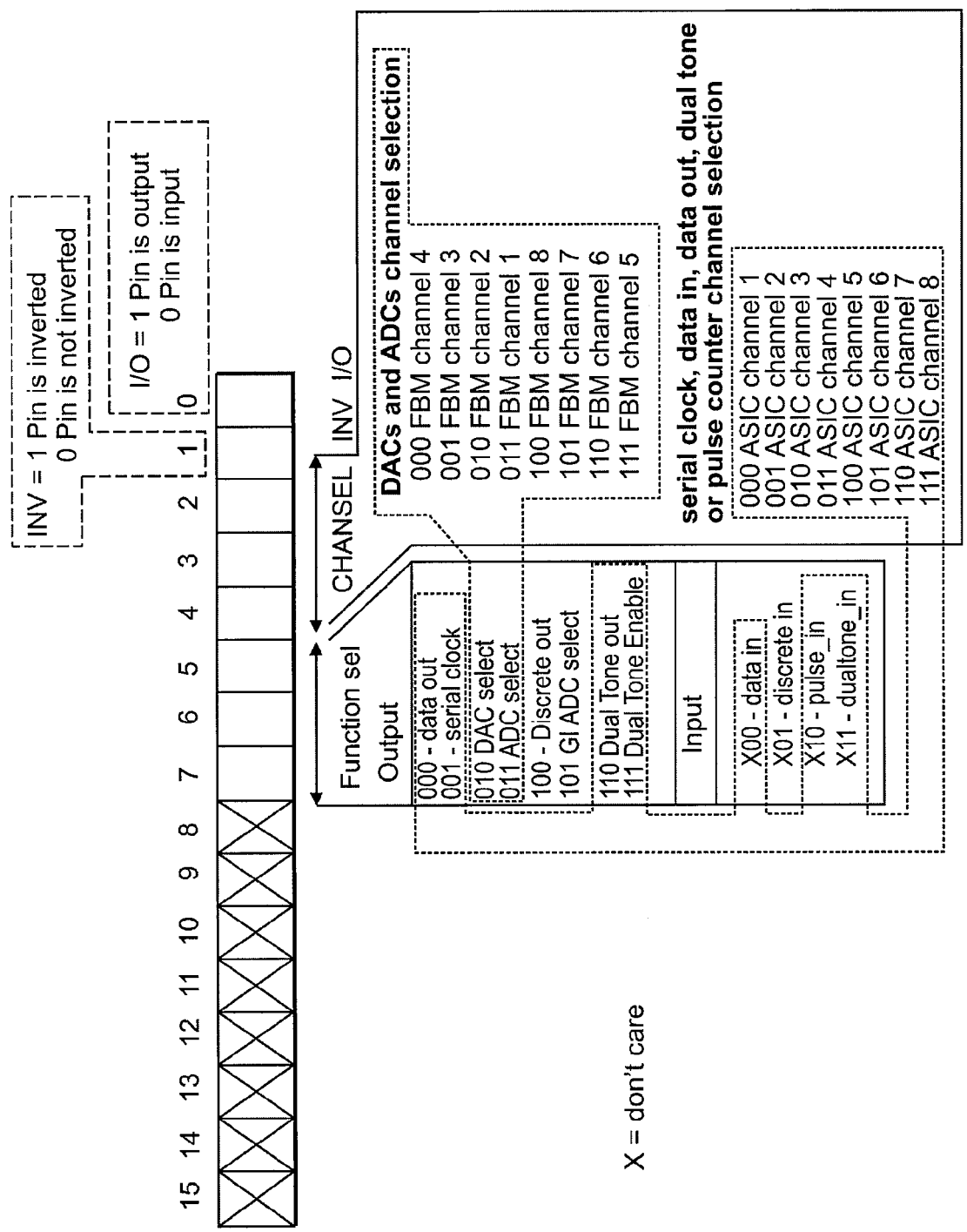
FIG. 26 depicts a mapping of the I/O bit, Inversion bit and I/O mux control bits for a pin controller for FIG. 25.

In FIG. 25, Din, Dout, Sclk refer to SPI functions. The first selection block controls which function is connected to the second mux. The second mux controls which channel's function is connected to the physical I/O Pin. In this diagram, Din, Sclk,Dout, DACs, ADCsel are driven by state machines, not by the processor. Pulse In is read by the pulse counter/period measurement section. Discrete input and Discrete output are read and written to respectively by the processor. The mapping of the I/O bit, Inversion bit and I/O mux control bits for each pin to registers is shown in FIG. 26. A memory map of these registers is shown in the table below:

| PIN MULTIPLEXER REGISTERS | | | | |
|---|---|---|---|---|
| HEX ADDRESS | NAME | RW | BIT | DESCRIPTION |
| 236 | IO Pin register 28 | RW | (D)7-0 | |
| 238 | IO Pin register 29 | RW | (D)7-0 | |
| 23A | IO Pin register 30 | RW | (D)7-0 | |
| 23C | IO Pin register 31 | RW | (D)7-0 | |
| 23E | IO Pin register 32 | RW | (D)7-0 | |

Figure 27:
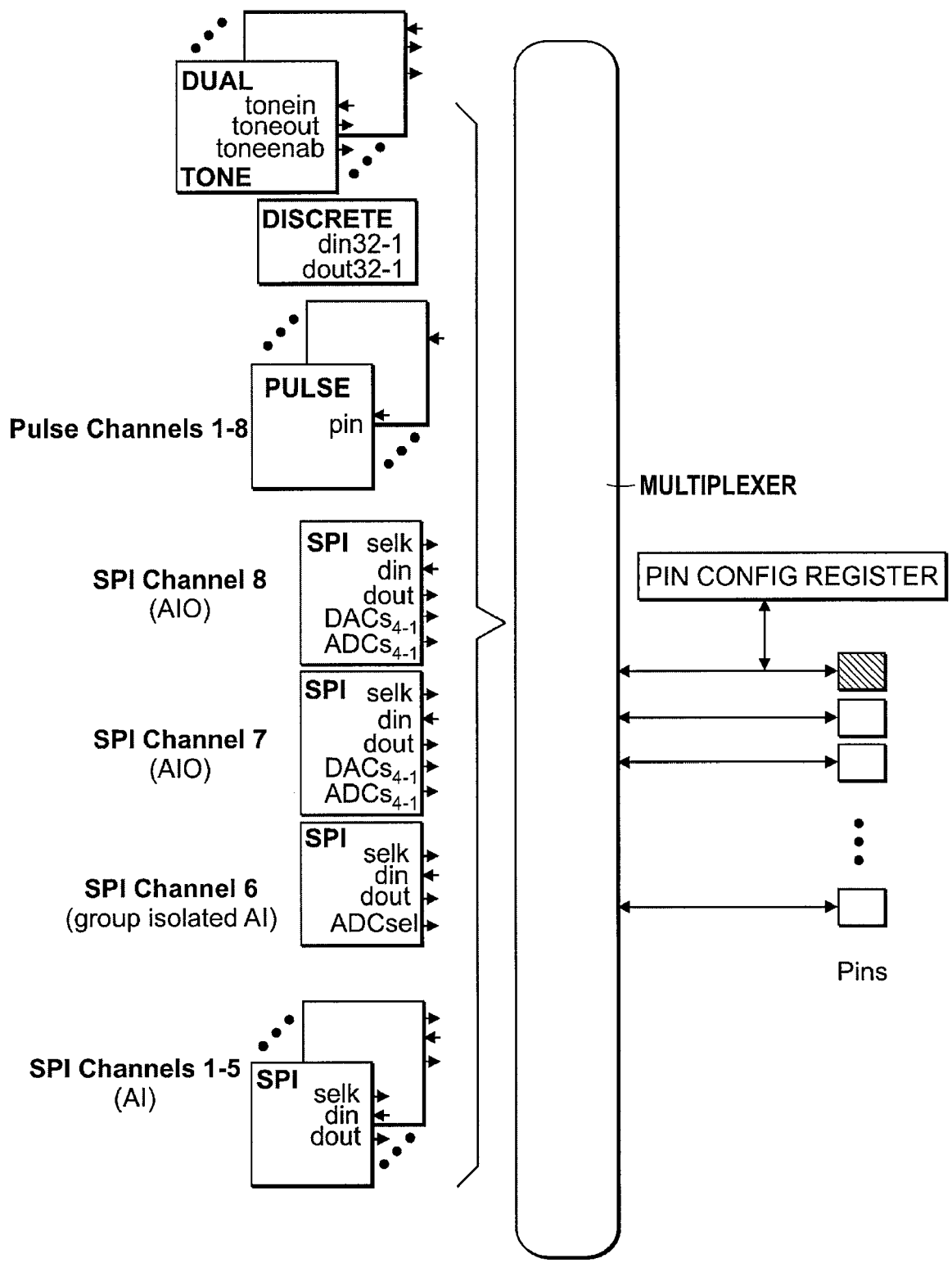
FIG. 27 depicts IO pin control registers in dual tone asynchronous block of FIG. 5.

Each physical IO_SIG31-0 pin of the CommControl ASIC package can be routed to any one of several SPI channel functions, discrete input or output bit, or pulse input channel. In the case of the SPI channel, the pin may be routed to either the SPI clock, data in, or data out. Furthermore, in the case of the analog outputs with readback, the physical pin may be routed to any one of four ADC select lines or any one of four DAC select lines. In the case of the group isolated analog inputs, the physical pin may also be routed to ADCsel. This is illustrated in FIG. 27.

Described above are methods and apparatus for communication across an isolation barrier meeting the objects set forth above, among others. It will be appreciated that the illustrated embodiment is merely an example of the invention and that other embodiments, incorporating changes therein, also fall within the scope of the invention. Thus, by way of example, it will be appreciated that inductive elements other than transformers may be used to carry the pulse width modulated and amplitude modulated signals between the control devices. By way of further example, it will be appreciated that the illustrated methods and apparatus can be used in control applications other than process control, e.g., industrial, environmental and other control applications. By way of still further example, it will be appreciated that PWM signals can be used to transfer information in both directions between the control devices. By way of still further example, it will be appreciated that the methods and apparatus discussed herein may be utilized for communications between any variety of control devices, not just controllers and field devices.

I claim:

1. A communications control system, comprising:
   A. a microprocessor controller coupled to a memory,
   B. a direct memory access (DMA) controller executing in said microprocessor controller,
   C. one or more independent synchronous serial communications high-level data link control (HDLC) channels that are coupled to the microprocessor controller, wherein the one or more HDLC channels exchange messages with a remote host under DMA control, and
   D. a configurable control element coupled to the memory that handles digital and analog input and output to effect a control applications.

2. The communications control system of claim 1, comprising chip selects for interfacing one or more external memory blocks or peripheral devices.

3. The communications control system of claim 2, comprising a chip select for an external flash memory device.

4. The communications control system of claim 2, comprising a chip select for an external RAM memory device.

5. The communications control system of claim 2, comprising chip selects for (i) an external flash memory device, (ii) an external RAM memory device, and (iii) an additional external peripheral.

6. The communications control system of claim 1, comprising one or more asynchronous DUAL TONE communication controllers that support any of FoxComm and HART communications protocols.

7. The communications control system of claim 1, wherein the one or more HDLC channels exchange messages of arbitrary length with the remote host.

8. The communications control system of claim 1, comprising one or more high-speed universal asynchronous receivers/transmitters (UARTs) that have a multiple-position first-in-first-out (FIFO) buffer.

9. The communications control system of claim 8, wherein the multiple-position FIFO is a sixty-four position FIFO.

10. The communications control system of claim 8, wherein the one or more FIFOs are utilized for local interboard communication.

11. The communications control system of claim 10, wherein the one or more FIFOs are utilized for local interboard communication in double and triple redundant modules.

12. The communications control system of claim 1, wherein the configurable element comprises a configurable i/o controller.

13. The communications control system of claim 12, wherein the configurable element has programmable i/o pins for interacting with external devices.

14. The communications control system of claim 12, wherein the configurable element interacts with external devices using a serial peripheral interface (SPI) protocol.

15. The communications control system of claim 12, wherein the configurable element comprises one or more state machines.

16. The communications control system of claim 15, wherein the configurable element interacts with external devices using a serial peripheral interface (SPI) protocol under control of the one or more state machines.

17. The communications control system of claim 16, wherein the one or more state machines leave the microprocessor controller free for tasks other than executing the SPI protocol for interacting with the external devices.

18. The communications control system of claim 12, wherein the configurable element includes a watchdog timer.

19. The communications control system of claim 18, wherein the watchdog timer resets the microprocessor controller if it fails to toggle a watchdog keep alive bit.

20. The communications control system of claim 1, wherein the configurable element comprises a modem configured to communicate using at least one of a HART protocol and a FoxComm protocol.

21. The communications control system of claim 20, wherein the modem is configured to communicate using HART protocol and FoxComm protocol.

\* \* \* \* \*